(12) United States Patent
Nelson et al.

(10) Patent No.: US 10,181,544 B2
(45) Date of Patent: Jan. 15, 2019

(54) PHOTOCONDUCTIVE SWITCH PACKAGE CONFIGURATIONS HAVING A PROFILED RESISTIVE ELEMENT

(71) Applicant: Lawrence Livermore National Security, LLC, Livermore, CA (US)

(72) Inventors: Scott D. Nelson, Patterson, CA (US); George J. Caporaso, Livermore, CA (US); Steven A. Hawkins, Livermore, CA (US); Hoang T. Nguyen, Livermore, CA (US); Stephen Sampayan, Manteca, CA (US); Li-Fang Wang, Livermore, CA (US)

(73) Assignee: Lawrence Livermore National Security, LLC, Livermore, CA (US)

( * ) Notice: Subject to any disclaimer, the term of this patent is extended or adjusted under 35 U.S.C. 154(b) by 87 days.

(21) Appl. No.: 15/204,833

(22) Filed: Jul. 7, 2016

(65) Prior Publication Data

US 2018/0013028 A1    Jan. 11, 2018

(51) Int. Cl.
*H01L 31/09* (2006.01)
*H03K 17/78* (2006.01)
*G02B 6/42* (2006.01)

(52) U.S. Cl.
CPC ............ *H01L 31/09* (2013.01); *H03K 17/78* (2013.01); *G02B 6/4295* (2013.01)

(58) Field of Classification Search
CPC .............. H01L 31/09; H01L 31/0224; H01L 31/022408; H01L 31/022416; H01L 31/16;
(Continued)

(56) References Cited

U.S. PATENT DOCUMENTS 3,231,744 A * 1/1966 Van Santen ............. C03C 17/00
                                                              250/208.3
3,308,308 A   3/1967 Bray
(Continued)

FOREIGN PATENT DOCUMENTS

EP    1 552 536 B1    6/2010
WO    2012/162702 A2  11/2012

OTHER PUBLICATIONS

Belser, R.B., "Electrical Resistances of Thin Metal Films before and after Artificial Aging by Heating," Journal of Applied Physics, 28(1):109-116, Jan. 1957.
(Continued)

*Primary Examiner* — Que T Le
*Assistant Examiner* — Jennifer Bennett
(74) *Attorney, Agent, or Firm* — Perkins Coie LLP

(57) ABSTRACT

Methods, systems, and devices are disclosed for photoconductive switch package configurations. In some aspects, a photoconductive switch package includes of a wide bandgap photoconductive material (e.g., GaN, ZnO, diamond, AlN, SiC, BN, etc.), a source for energetic photons (e.g., a laser), a mechanism to couple the laser into the switch, and a mechanism for high voltage to enter and leave the switch package. In some implementations, the disclosed photoconductive switch packages can be configured as a three terminal device, e.g., similar to transistors, with one of the terminals being laser input or the voltage input to the laser system.

29 Claims, 19 Drawing Sheets

(58) Field of Classification Search
CPC .......... H01L 31/0203; H01L 31/02327; H03K 17/78; G02B 6/4295
See application file for complete search history.

(56) References Cited

U.S. PATENT DOCUMENTS

| | | | |
|---|---|---|---|
| 4,376,920 | A | 3/1983 | Smith |
| 5,323,024 | A * | 6/1994 | Adams .................... H01L 31/08 257/432 |
| 6,943,319 | B2 | 9/2005 | Jones |
| 7,897,490 | B2 | 3/2011 | Preble et al. |
| 8,125,089 | B2 | 2/2012 | Caporaso et al. |
| 8,258,632 | B1 * | 9/2012 | Sullivan .................. H01L 31/09 257/433 |
| 8,299,554 | B2 | 10/2012 | Adkisson et al. |
| 2005/0100866 | A1 * | 5/2005 | Arnone ................ A61B 5/0088 433/215 |
| 2007/0059856 | A1 * | 3/2007 | Takeuchi ............. G02B 6/4206 438/30 |
| 2010/0282949 | A1 * | 11/2010 | Caporaso ................ H01L 31/09 250/214 SW |
| 2013/0328058 | A1 | 12/2013 | Nelson |
| 2013/0328146 | A1 * | 12/2013 | Nelson ................ H01L 31/0224 257/432 |
| 2013/0342306 | A1 | 12/2013 | Sampayan |
| 2014/0363123 | A1 | 12/2014 | Caporaso |
| 2017/0264291 | A1 | 9/2017 | Nelson et al. |

OTHER PUBLICATIONS

Sali, S., et al., "Triaxial cable designs with optimum braided shields," IEE Proceedings A (Physical Science, Measurement and Instrumentation, Management and Education), 137(4):165-174, Jul. 1990.

Sullivan, J.S., "Wide Bandgap Extrinsic Photoconductive Switches," ProQuest Dissertations and Theses, Ph.D. Thesis University of California, Davis, 2013, vol. 75-03(E), Sec. B, 375 pages, Jul. 2013.

* cited by examiner

PHOTOCONDUCTIVE SWITCH PACKAGE CONFIGURATIONS HAVING A PROFILED RESISTIVE ELEMENT

STATEMENT REGARDING FEDERALLY SPONSORED RESEARCH OR DEVELOPMENT

The United States Government has rights in this invention pursuant to Contract No. DE-AC52-07NA27344 between the U.S. Department of Energy and Lawrence Livermore National Security, LLC, for the operation of Lawrence Livermore National Laboratory.

TECHNICAL FIELD

This patent document relates to systems, devices, and processes that use photoconductive switch technologies.

BACKGROUND

A photoconductive switch is an electrical switch that is controlled by an optical input (e.g., light) to cause photo-induced conductivity of the switch material. For example, light applied to the switch material can increase its electrical conductance as a consequence of irradiation with light.

SUMMARY

Techniques, systems, and devices are disclosed for photoconductive switch package configurations. In some aspects, a photoconductive switch package includes a wide bandgap photoconductive material (e.g., GaN, ZnO, diamond, AlN, SiC, BN, etc.), a source for energetic photons (e.g., a laser), a mechanism to couple the laser into the switch, and a mechanism for high voltage to enter and leave the switch package.

The subject matter described in this patent document can be implemented in specific ways that provide one or more of the following features. The various disclosed photoconductive switch package configurations include mechanisms to control high voltage signals switching while maintaining low capacitance and inductance. The disclosed technology includes methods and mechanisms for reducing detrimental electric field effects, for optical coupling, and for extracting high voltage and high current from the switch package. For example, the disclosed photoconductive switch packaging technology can include non-profiled electrode designs capable of conducting high voltage and/or high current electrical signals based on an optical trigger. For example, in some implementations, the disclosed photoconductive switch package includes a profiled resistive material structure (e.g., a lossy dielectric or a resistive thin film) attached to the switch body that provides relief of electric field stress concentrations. For example, the disclosed photoconductive switch packaging technology provides optical input flexibility including single or multiple optical inputs to the photoconductive switch. For example, in some implementations, the disclosed photoconductive switch package includes reflective coatings and waveguides to direct the light from a single input source (e.g., laser) into the switch to provide sufficiently uniform switch activation. For example, in some implementations, the disclosed photoconductive switch packages can be configured as a three terminal device, e.g., similar to transistors, with one of the terminals being laser input and the other two terminals providing the current path that the laser input controls.

DETAILED DESCRIPTION

Figure 1A:
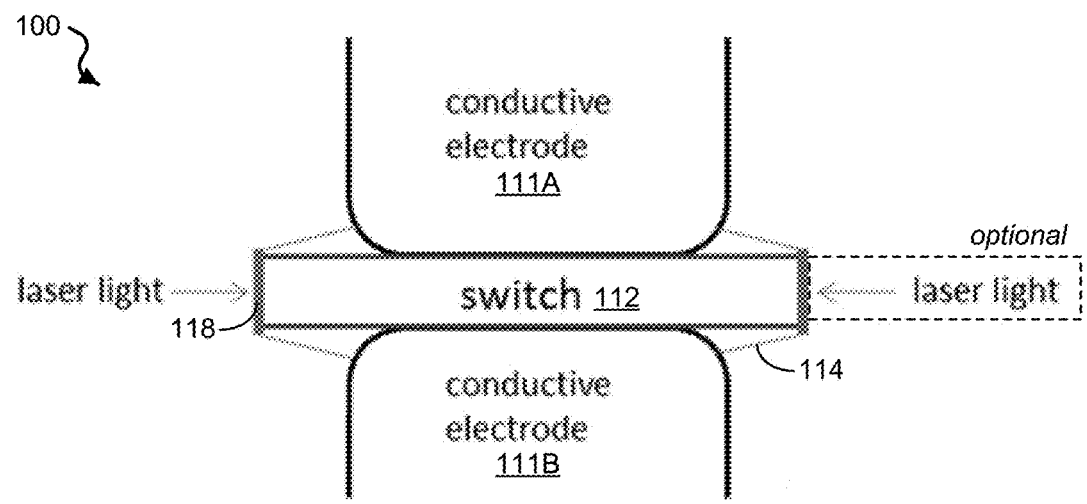
FIG. 1A shows a diagram of an exemplary photoconductive switch package of the disclosed technology.

Photoconductive switches can be used for photoconductive sampling, generation of high frequency pulses (e.g., terahertz pulses), high-speed photodetectors in optical fiber communications, and in analog-to-digital converters, among other applications. Yet, photoconductive switches typically are not able to reliably withstand both high voltage and high switch current. The photoconductive wide bandgap semiconductor material of a photoconductive switch can conduct large currents based on high voltage potentials across the switch due to the material's very low resistance in photoconductive mode under proper optical excitation conditions. However, these conditions can cause enhanced electric field effects that exceed the electric field strength of the photoconductive wide bandgap semiconductor material, in which the material can fail by electrical breakdown. These electric field enhancements must be minimized for robust, long-term reliability of photoconductive switch devices or circuits.

High voltage and high current switches have broad applicability, e.g., particularly in the charged particle accelerator community. The ability to modulate high voltage and high current can be an enabling technique for pulsed systems, e.g., such as radar systems, communication systems, and arbitrary-waveform generated high power RF sources.

Disclosed are devices, systems, and methods for photoconductive switching including switch package configurations capable of operating under high voltage and current conditions. In some aspects, a photoconductive switch package of the present technology includes a wide bandgap photoconductive material (e.g., GaN, ZnO, diamond, AlN, SiC, BN, etc.), a source for energetic photons (e.g., a laser), a mechanism to couple the laser into the switch, and a mechanism for high voltage to enter and leave the switch package.

This disclosed technology includes various wide bandgap photonic crystal switch package configurations that enable different package applications. For example, the disclosed photoconductive switch packages can include profiled resistive structures (e.g., profiled lossy dielectrics or resistively tapered thin films) on the photoconductive switch between conductive electrodes, e.g., such that the electrodes include non-profiled electrode designs. In such configurations, the interface between the electrode and the photoconductive switch via the profiled resistive structure minimizes localized electrical field effects that may cause undesired electrical breakdown of the photoconductive switch under high voltage or high current operating conditions. Moreover, the disclosed photoconductive switch packages can be configured such that the photoconductive switch is optically coupled with an optical input from one or more transverse edges, or with an optical input from the axial face or axial faces. Additionally, the disclosed photoconductive switch packages can include photoconductive switch elements having non-hexahedral geometries, and/or contoured switch material to accommodate contoured embedded electrodes for electric field stress relief. Also, the disclosed photoconductive switch packages can include multi-sided reflective coatings to maximize optical efficiency.

The disclosed photoconductive switch package technology addresses optical confinement of optical energy in small switches. The disclosed technology can be used in applications including, but not limited to, high current and/or high voltage switches, modulated systems, radar systems, power switching applications (e.g., inverters, power supplies), and high frequency signaling and communications systems, etc. and in areas such as high power microwave sources, high power RF devices, radar systems, high current switching systems, communications systems, power electronics, as well as solid state radar systems, optically controlled high voltage switch, optically controlled high current switch, laser controlled high voltage switch, laser controlled high current switch, solid state high power communications systems.

FIG. 1A shows a diagram of an exemplary photoconductive switch package 100 of the disclosed technology. The photoconductive switch package 100 includes a photoconductive switch 112 structured to include a wide bandgap photoconductive material, and two conductive electrodes 111A and 111B interfaced at opposite ends of the wide bandgap photoconductive material of the switch 112. For example, the wide bandgap photoconductive material of the switch 112 can include GaN, ZnO, diamond, AlN, SiC, or BN. In some embodiments, for example, the photoconductive switch 112 may be structured to have a profiled shape, e.g., particularly at the interface with an adjacent or abutting material, such as a profiled lossy dielectric material or resistively tapered thin film structure, described below.

The photoconductive switch package 100 includes a profiled structure 114 attached to the wide bandgap photoconductive material, in which the profiled structure 114 includes a resistive profile material, e.g., such as a profiled lossy dielectric or resistively tapered thin film. In some implementations, for example, the photoconductive switch package 100 can include an indium tin oxide (ITO), zinc oxide (ZnO), or other similar transparent and electrically conductive coating between the profiled structure 114 and the photoconductive switch 112. The profiled resistive material structure 114 can exhibit a defined resistivity curve to allow for relief of electric field stress concentrations. For example, the exemplary profiled resistive materials used in the structure 114 can taper the electric field intensity across the profiled material. In some embodiments, the profiled resistive material may be implemented as a thick, profiled coating, e.g., including a conductive epoxy with a geometric profile (e.g., such as a curved profile as shown in FIG. 1A); or as a thin film with the equivalent profile (in units of ohms per square).

In implementations of the photoconductive switch package 100, the switch 112 is optically coupled to a source of energetic photons, e.g., such as a laser. In some implementations, for example, the electrically conductive electrodes 111A and 111B are in electrical communication with a high voltage source. When the source of energetic photons (e.g., laser) emits photons into the switch 112, the wide bandgap photoconductive material of the switch 112 conducts an electrical signal between the electrodes 111A and 111B. In the example embodiment shown in FIG. 1A, the photoconductive switch package 100 includes an antireflective (AR) coating 118 on the face or faces of the switch 112 that interface with the light source or sources (e.g., laser). In some embodiments of the photoconductive switch package 100, for example, the photoconductive switch package 100 can include a high reflection (HR) coating 119 on one or both out-of-plane faces of the wide bandgap photoconductive material of the switch 112, e.g., to cause internal reflections of the inputted light within the wide bandgap photoconductive material of the switch 112.

In some embodiments, for example, the photoconductive switch package 100 can include an encapsulation structure (e.g., an epoxy) that surrounds the interface of the electrodes 111A and 111B and the switch 112 except for two openings of the encapsulation structure on opposing sides at least partially exposing the switch 112 and allowing the source of energetic photons (e.g., laser) to transmit the light to the switch 112.

Figure 1B:
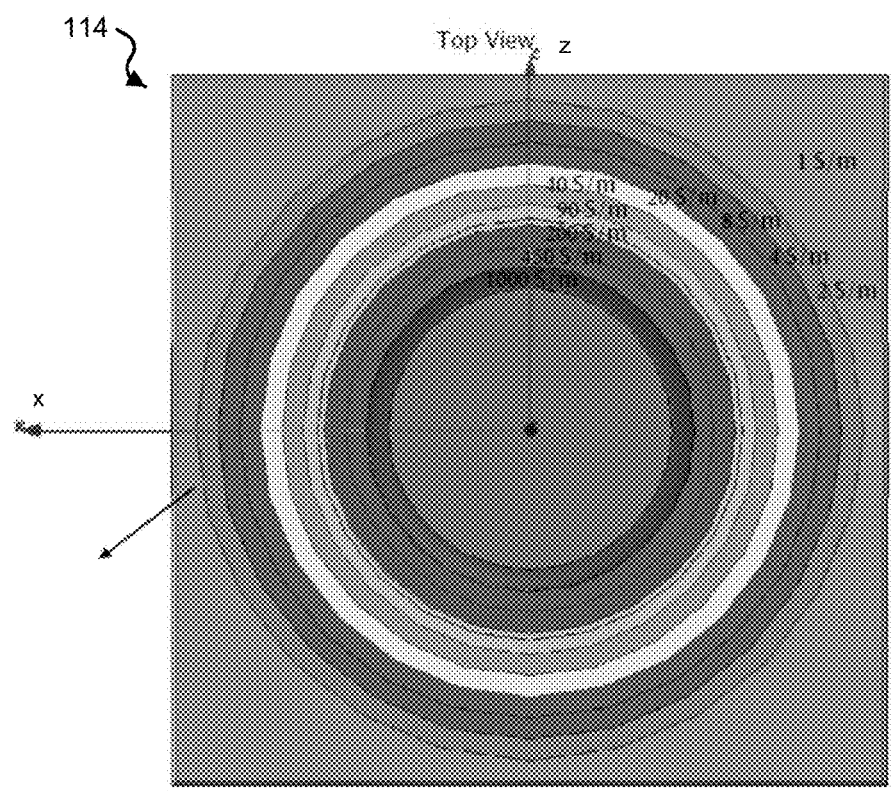
FIG. 1B shows a top view diagram of an example of the resistive profiled structure in a photoconductive switch package of the present technology, depicting resistive surface profiling of the structure.

FIG. 1B shows a top view diagram of an example of the resistive profiled structure 114 in a photoconductive switch package of the present technology, e.g., such as the photoconductive switch package 100. The diagram of FIG. 1B illustrates the resistive surface profiling of the structure 114. For example, the diagram of FIG. 1B shows that in a side-illumination technique for operations of the photoconductive switch package (e.g., like that shown in FIG. 1A, and later in FIG. 1D) the center circle of the resistive profiling is highly conductive. Yet, in the case of an axial (top) illumination technique for operations of the disclosed photoconductive packages (e.g., such as those shown later in FIGS. 1H and 1J), the center circle is masked so that it is not resistive nor conductive (e.g., a hole in the mask). The profiled structure 114 provides a specific, engineered profile of resistivity (e.g., thicknesses) of the material of structure 114 to shape (e.g., reduce) the electric field enhancement points.

Figure 1C:
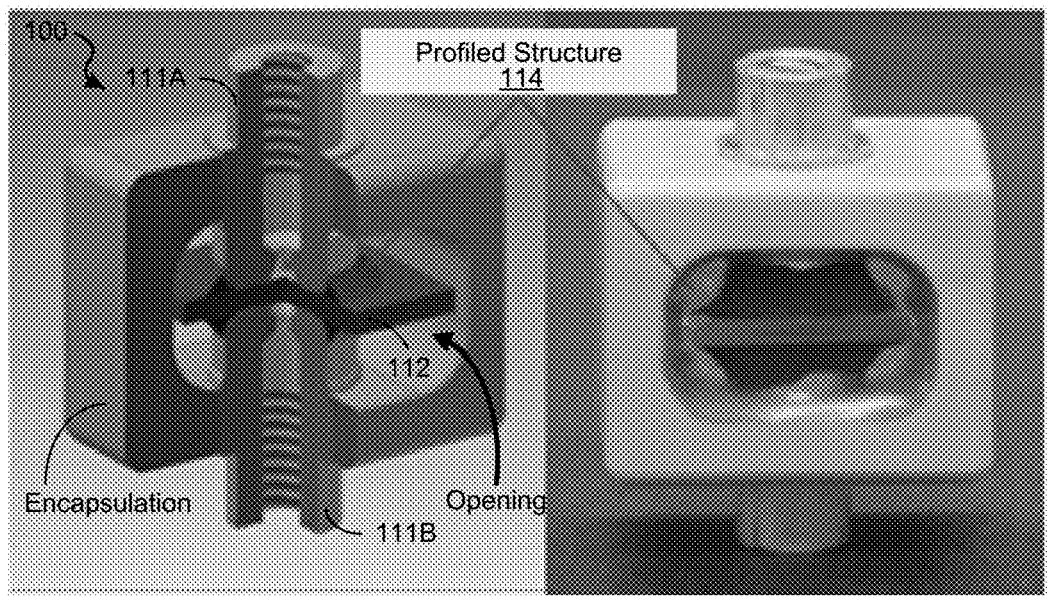
FIG. 1C shows a three dimensional schematic diagram and picture of the exemplary photoconductive switch package showing an exemplary encapsulation structure partially enclosing the photoconductive switch package.

FIG. 1C shows a three dimensional schematic diagram (left side of FIG. 1C) of the exemplary photoconductive switch package 100 showing the encapsulation structure partially enclosing the interface of the electrodes 111A and 111B and the switch 112 and providing openings to optically couple a photon emission source with the switch 112. FIG. 1C also shows a picture (right side of FIG. 1C) of an example embodiment of a photoconductive switch packaging device of the disclosed technology. The exemplary photoconductive switch packaging device can include one or more of the following exemplary features. For example, the exemplary photoconductive switch packaging device can be configured to have a square photoconductive switch. For example, the exemplary photoconductive switch packaging device can be configured to have an M plane cut. For example, the square photoconductive switch can be configured to have a size of 10 mm×10 mm, with a 1 mm thickness. For example, the profiled resistive material coating can be configured as a thin film tapered resistive surface treatment, or have constant conductivity with tapered geometric profile resistive material. For example, the photoconductive switch can be configured to have an antireflective (AR) coating. For example, in an axial configuration an HR coating can be configured on all four edges of the square photoconductive switch. For example, an exemplary epoxy encapsulation structure can be configured to have a size of 10 mm×14 mm to surround the exemplary square photoconductive switch. For example, the dielectric constant ($\varepsilon_r$) of the profiled resistive material coating can be configured to be 10 times that of the epoxy encapsulation structure. In some embodiments, for example, the entire switch package may be surrounded by the exemplary epoxy encapsulant (e.g., which can be encapsulated by potting the entire switch package 100 in epoxy, like the example shown later in FIG. 11A on the right-hand side of the image). In some implementations, for example, the epoxy encapsulant can provide a dielectric constant of 10 (e.g., $e_r=10$ using the standard electrical engineering notation for relative dielectric permittivity). For example, the exemplary photoconductive switch packaging device can be configured to receive the laser light via a fiber feed, e.g., in which the light is transversely fed (e.g., edge fed) by the laser. For example, the laser can be a 532 nm laser. For example, the photoconductive switch packaging device can be configured to have a single module feed into a coax-to-waveguide adapter.

Implementations of the disclosed photoconductive switch packaging technology can include one or more of the following features and advantages. For example, the disclosed photoconductive switch package devices can be optically coupled to a single optical input or to multiple optical inputs from one or more transverse edges, e.g., and including optical coupling with the optical input from the axial face of the exemplary photoconductive switch. For example, the disclosed photoconductive switch package technology can include non-profiled electrode designs that provide high voltage and/or high current conduction across the photoconductive switch material. For example, exemplary photoconductive switch components of the disclosed photoconductive switch package devices can include non-hexahedral switch geometries, e.g., such as rounded or circular geometries. For example, the photoconductive switch can include a multi-sided reflective coating to maximize optical efficiency. In some implementations, for example, the disclosed photoconductive switch package devices may include a contoured switch configuration to accommodate contoured embedded electrodes for electric field stress relief. These and other features of the disclosed technology are discussed.

The disclosed photoconductive switch packaging technology can include non-profiled electrode designs capable of conducting high voltage and/or high current electrical signals based on an optical trigger. For example, one advantage of non-profiled electrode designs is ease of fabrication of the photoconductive switch package. Most conventional high voltage structures use defined rounded shaped electrodes in order to minimize electric field stress there by reducing the possibility of electric breakdown. In the disclosed technology, the profiled resistive material (e.g., a lossy dielectric or a resistive thin film) allows for simple electrode designs to be utilized, e.g., such as flat interface features and non-embedded structures of the electrodes and photoconductive material body. In this case, the profile of the resistive material can provide similar benefits as contoured electrodes would otherwise. This allows for simple (e.g., fundamental shape; blunt electrodes) electrode configurations without the necessity of complex geometries or machining.

The disclosed photoconductive switch packaging technology provides optical input flexibility. Some configurations can use transverse optical inputs for the light delivery system. For example, light can be fed from one or two opposing facets of a hexahedrial configuration of the switch 112. This two-sided input configuration can be desirable, for example, due to loss through the wide bandgap photonic crystal material. Yet, in some exemplary implementations of the disclosed photoconductive switch packaging technology, using a series of reflective coatings and waveguides to direct the light into the switch, it is possible to utilize only one optic input source (e.g., laser) to provide sufficiently uniform switch activation.

The disclosed photoconductive switch packaging technology can include contoured switch material designs capable of conducting high voltage and/or high current electrical signals based on an optical trigger. Electrodes in wide bandgap photonic crystal switch package configurations that terminate at the surface of the switch exhibit a common possibility for electrical arcing from electrode to electrode (e.g., either through the bulk of the switch, or around on the surfaces of the switch). According to the present technology, embedding the electrode into a contoured switch material profiled to accept the electrode, for example, both relieves the electric field stress and also increases any potential surface tracking.

Figure 1D:
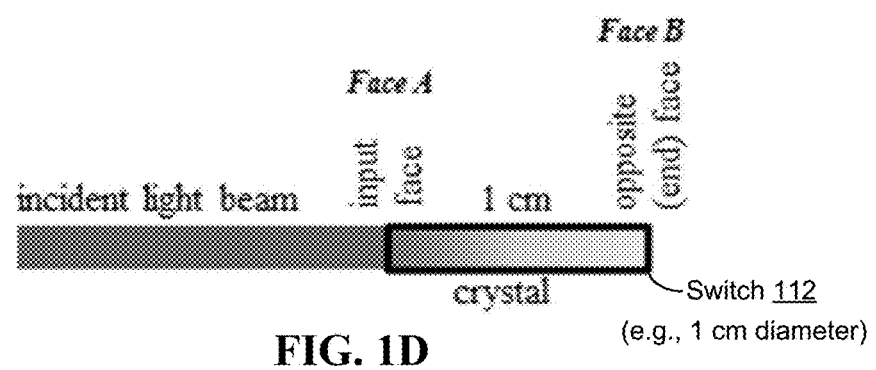
FIG. 1D shows a diagram of an example block photoconductive switch receiving an incident light beam at the edge surface (edge fed).

In some embodiments of the disclosed photoconductive switch packaging technology, for example, some photoconductive switch designs can include wide bandgap photonic crystal designs that have utilized hexahedrial switch geometries (e.g., a block or brick element). In such configurations, for example, an optical input can be arranged from a transverse position (e.g., at a side edge of the photoconductive switch) such that the optical energy enters the switch 112 from this direction, as shown in FIG. 1D. FIG. 1D shows a diagram of an example block photoconductive switch 112 receiving an incident light beam at the edge surface (edge fed). The edge-fed rectangular wide bandgap photoconductive material of the switch 112 can have an absorption profile across the volume of the crystal. As light propagates across the material, the loss in optical intensity occurs due to absorption in the crystal. For example, for large crystals, making the opposite face 100% reflective will direct the light that reaches the end face back towards the input face. In some implementations, for example, the reflectivity may be achieved via a reflective coating or coatings, and/or angled crystal facet, at the edges of the wide bandgap photoconductive crystal. In some embodiments, the exemplary dielectric encapsulant can function as the reflective mechanism. For example, by using an encapsulant that has a higher dielectric constant that the switch material, a reflective surface is obtained without the need to provide a separate reflective coating on the edge surfaces. For example, a $BaSrTiO_3$ encapsulant can produce an electric field reflection of 96% at the switch/encapsulant interface. For example, in the example embodiment shown in FIG. 1D, the switch 112 can include an antireflective (AR) coating on the face of the switch 112 that interface with the light source providing the incident light beam (e.g., laser), and a high reflection (HR) coating that can be configured on the three remaining faces (e.g., other face not interfaced with a light source, and the two out-of-plane faces of the switch 112), e.g., to cause internal reflections of the inputted light within the wide bandgap photoconductive material of the switch 112.

Figure 1E:
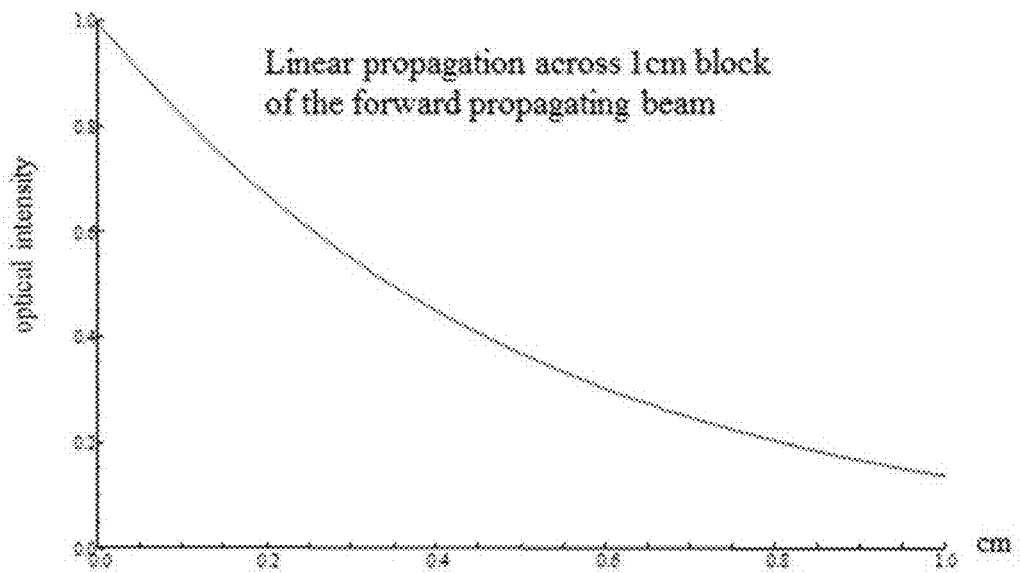
FIGS. 1E-1G show data plots depicting the optical intensity of light propagation within the exemplary block photoconductive switch of FIG. 1D.
Figure 1F:
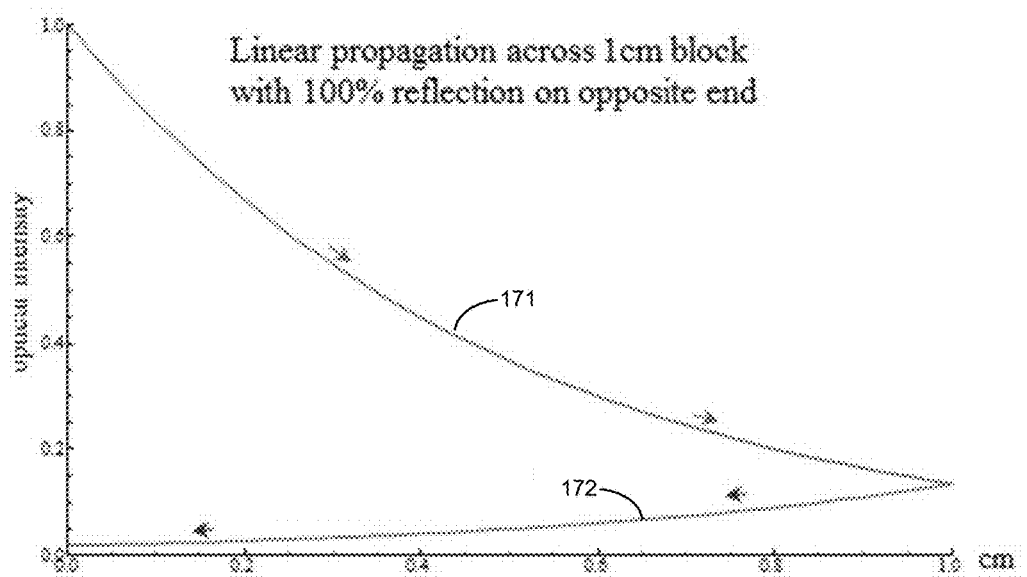
Figure 1G:
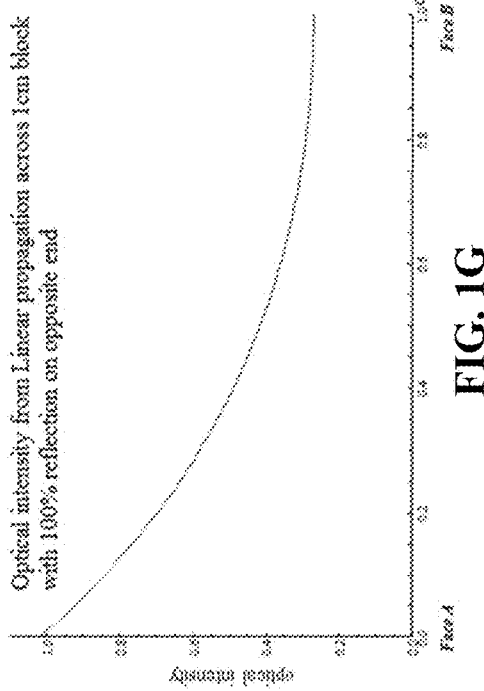

FIGS. 1E-1G show data plots depicting the optical intensity of light propagation within the exemplary block switch of FIG. 1D. The data plot of FIG. 1E shows the linear propagation across an exemplary 1 cm block photoconductive switch of the forward propagating beam. The data plot of FIG. 1F shows the linear propagation across an exemplary 1 cm block photoconductive switch with 100% reflection on the opposite end, including a forward propagation beam 171 from the input face to the end face, and a back propagation beam 172 from the end face to the input face. The data plot of FIG. 1G shows a cumulative optical intensity from linear propagation across an exemplary 1 cm block photoconductive switch both forwards and backwards. In FIG. 1G, the optical intensity profile is the sum of the two waveforms 171 and 172 shown in FIG. 1F.

In some embodiments of the disclosed photoconductive switch packaging technology, for example, the photoconductive switch 112 can be structured in a rounded or circular switch configuration. By employing the single optical input technique with the disclosed round switch configuration, the exemplary photoconductive switch package allows for simplified optical feed structures in order to provide sufficiently uniform switch illumination.

Figure 1I:
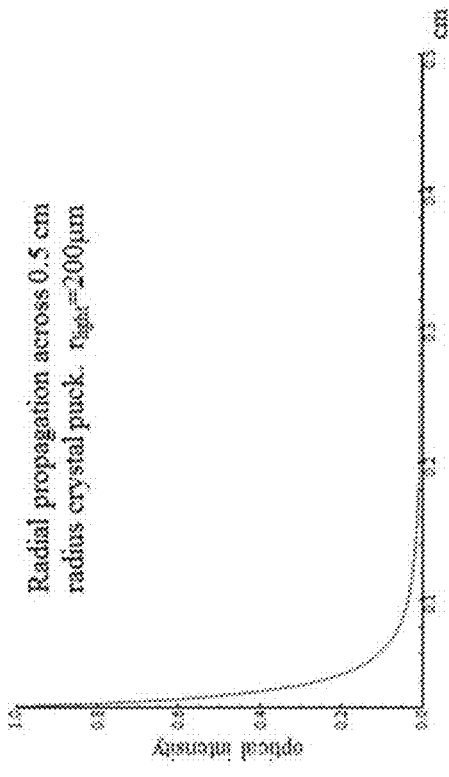
FIG. 1I shows a plot depicting the optical intensity of light propagation within the exemplary photoconductive switch of FIG. 1H.
Figure 1H:
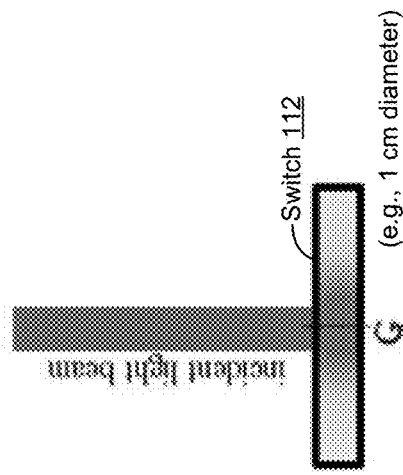
FIG. 1H shows a diagram of an example circular photoconductive switch receiving an incident light beam at the top center surface (axially fed).

One example configuration using an exemplary rounded or circular photoconductive switch of the disclosed technology is as follows. The optical input can be arranged from an axial position (e.g., above the photoconductive switch) such that the optical energy enters the switch 112 from the axial direction, as shown in FIG. 1H, and light then propagates out towards the edges of the switch. FIG. 1H shows a diagram of an example circular photoconductive switch 112 receiving an incident light beam at the top center surface (axially fed). For example, in the example embodiment shown in FIG. 1H, the switch 112 can include a high reflection (HR) coating on the faces of the switch 112 (e.g., all four faces), e.g., to cause internal reflections of the inputted light within the wide bandgap photoconductive material of the switch 112. The exemplary wideband photoconductive material of the switch 112 can have a diffusion profile and absorption profile across the volume of the material crystal. As light propagates out of the centerline of the switch 112, as shown in the diagram, there is a reduction in optical intensity that occurs, e.g., due to $1/r^2$ diffusion, and to a lesser extent to the absorption in the crystal. FIG. 1I shows a plot of the optical intensity of light propagation in the exemplary circular switch of FIG. 1H with respect to the radius of the photoconductive material. For example, the photoconductive switch can be in various shapes, e.g., including a rounded or circular disk shape, or a square or block shape. The exemplary photoconductive switch can be configured such that, in the switch, the optical energy is confined transversely (e.g., with axial feed) by the presence of metal electrodes, and the optical energy is confined longitudinally (e.g., at the edges) by a reflective coating to prevent optical energy from leaving the switch along this direction. This optical energy is then reflected back into the bulk of the switch volume for continued utilization, e.g., until consumed. For example, the direction that optical energy enters the switch is different than the direction that optical energy is prevented from leaving the switch (e.g., unlike a light-capturing solar cell), and the switch includes a substantial volume (e.g., unlike a slab LED structure which generates its own light). For example, in some implementations, the switch 112 of the disclosed photoconductive switch package is operable as a bulk switch, in which substantially the entire thickness (e.g., 1 mm thickness) of the switch is used in the switching process (e.g., as well as the majority of the 1 cm×1 cm cross section). The example 1 mm thickness can lead to higher operating voltages, e.g., since thick dielectrics that breakdown at a higher voltage, in contrast to thin dielectrics that breakdown at a low voltage. In some implementations, the switch 112 can use approximately 49 mm³ as its active volume when in the axial-fed mode, for example. Also, for example, in the case of laser excitation producing the optical energy, the edge-based reflective coating includes a dielectric layer tuned to the wavelength of the laser, e.g., since this is a high-voltage holding device, a metallic reflective layer specifically should not be used in this application.

Figure 1J:
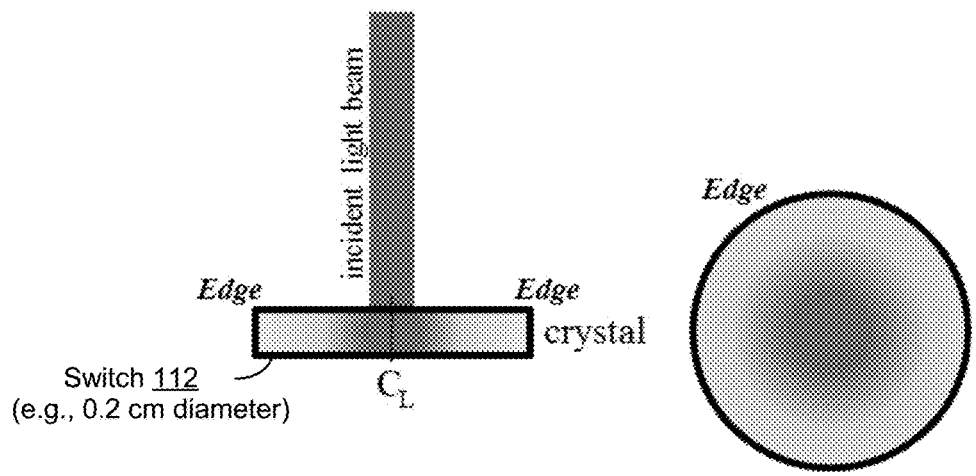
FIG. 1J shows a diagram of an example small, circular photoconductive switch receiving an incident light beam at the top center surface (axially fed).

In some implementations of the exemplary axially-fed and rounded photoconductive switch of the disclosed technology, the size of the photoconductive switch can be small (e.g., 0.2 cm diameter). For example, as shown in FIG. 1J, an optical input can be arranged from an axial position (e.g., above an exemplary 0.2 cm diameter photoconductive switch) such that the optical energy enters the switch 112 from the axial direction, and light then propagates out towards the edges of the switch. FIG. 1J shows a diagram of an example small, circular photoconductive switch 112 receiving an incident light beam at the top center surface (axially fed). For example, in the example embodiment shown in FIG. 1J, the switch 112 can include a high reflection (HR) coating on the faces of the switch 112 (e.g., entire perimeter of the rounded switch 112), e.g., to cause internal reflections of the inputted light within the wide bandgap photoconductive material of the switch 112. For example, the top center-fed small, circular wide bandgap photoconductive material can have a diffusion profile and an absorption profile across the volume of the crystal. As light propagates out from the centerline of the crystal, reduction in optical intensity occurs due to $1/r^2$ diffusion and absorption in the crystal. For example, by making the circumferential face 100% reflective, the wide bandgap photoconductive material directs the light that reaches this end back towards the centerline (CL) of the crystal. Reflectivity can be achieved via reflective coating(s), or edge treatment, at the edges of the crystal. For crystals that are smaller, or that are less lossy, absorption dominates the propagation rather than diffusion. In this case, reflective edge treatment is very beneficial.

Figure 1K:
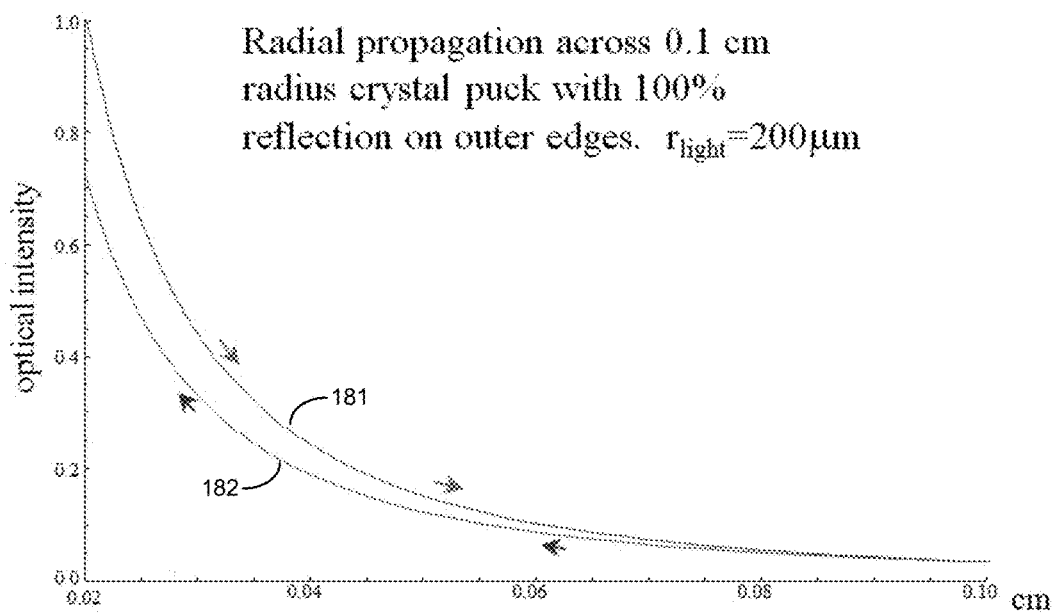
FIGS. 1K-1M show data plots depicting the optical intensity of light propagation within the exemplary small, circular photoconductive switch of FIG. 1J.
Figure 1L:
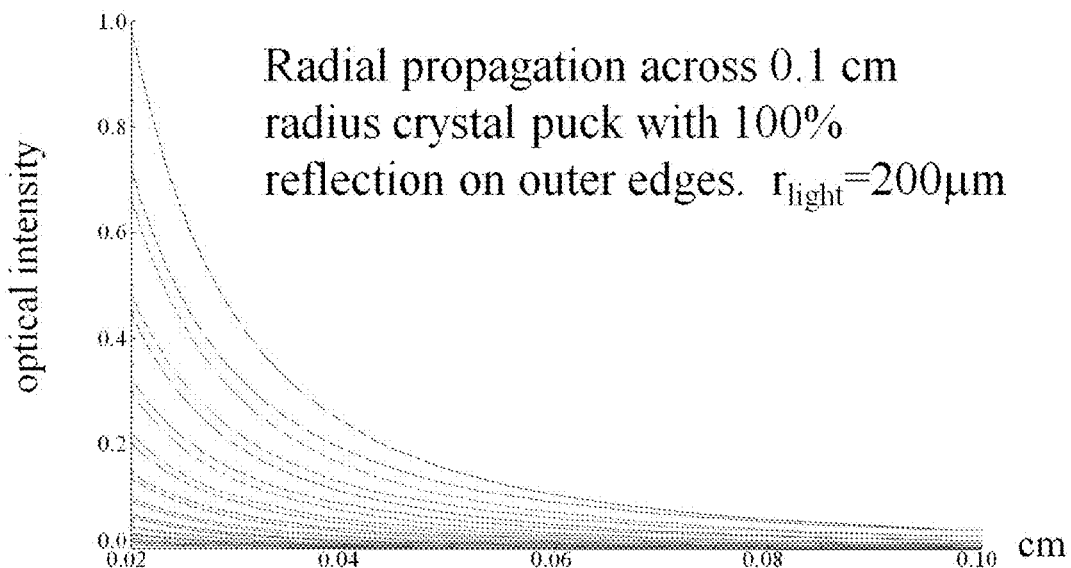
Figure 1M:
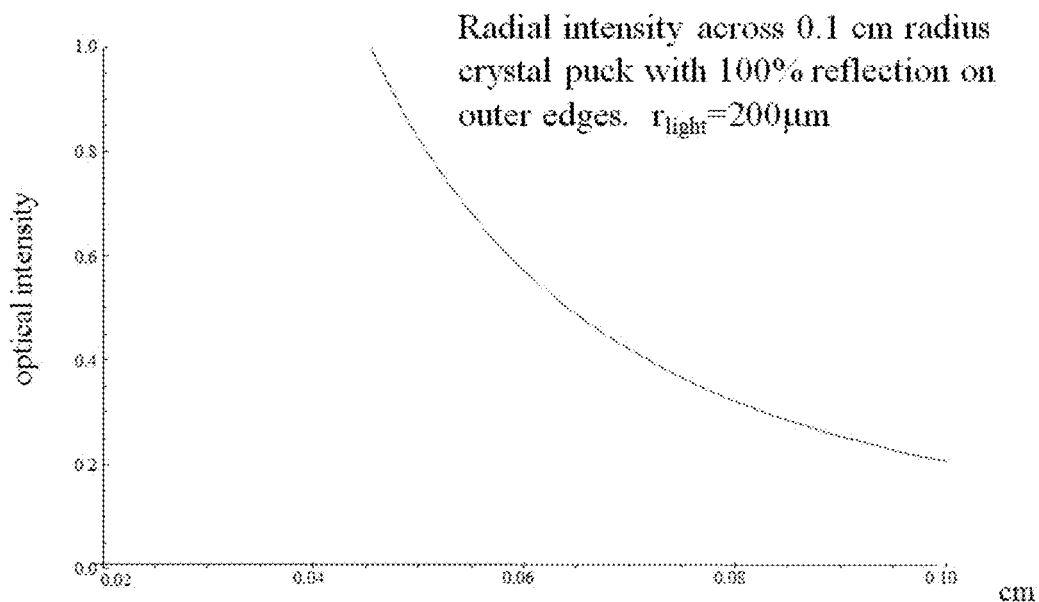

FIGS. 1K-1M show data plots depicting the optical intensity of light propagation within the exemplary small, circular photoconductive switch of FIG. 1J. The data plot of FIG. 1K shows the radial propagation across an exemplary 0.1 cm radius circular photoconductive switch with 100% reflection on the outer edges (e.g., the radius of the light, $r_{light}$=200 µm), including an outward propagation beam 181 from the center to edge, and an inward propagation beam 182 from the edge to the center. The data plot of FIG. 1L shows radial propagation waveforms across the exemplary 0.1 cm radius circular photoconductive switch with 100% reflection on the outer edges, including the outward and inward propagation beams between the center and the edge. The data plot of FIG. 1M shows a cumulative optical intensity from radial propagation across the exemplary 0.1 cm radius circular photoconductive switch both outwards and inwards. In FIG. 1M, the optical intensity profile is the sum of the waveforms shown n FIG. 1L.

Figure 2:
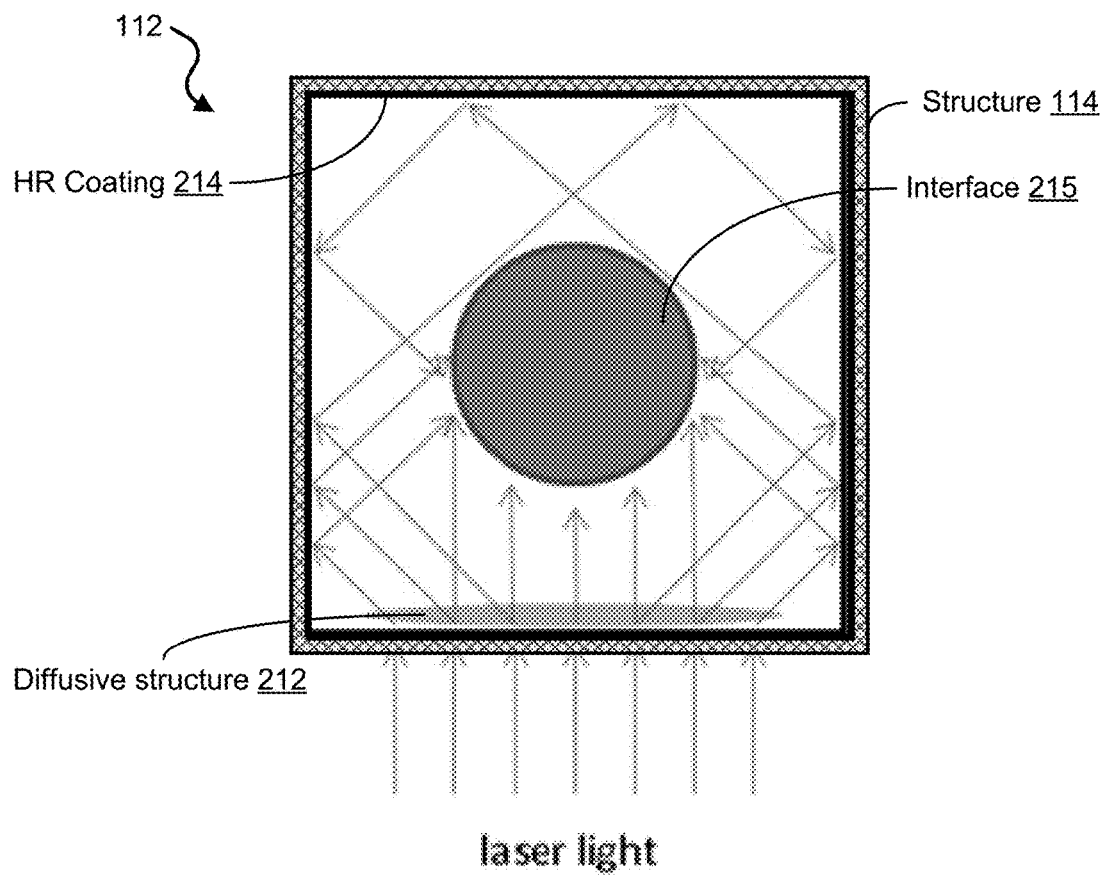
FIG. 2 shows a diagram an exemplary switch of the photoconductive switch package including a multi-sided optical waveguide distribution.

FIG. 2 shows a diagram depicting an upper cross sectional view of an exemplary embodiment of the photoconductive switch 112 of the photoconductive switch package 100 providing a multi-sided optical waveguide feed for a single laser light source optically coupled with the photoconductive switch package 100. For example, in the example embodiment shown in FIG. 2, the switch 112 can include an antireflective (AR) coating on the face of the switch 112 that interface with the laser light source. The switch 112 includes a high reflection (HR) coating 214 on one or more regions of the wide bandgap photoconductive material (e.g., shown in the embodiment of FIG. 2 on the three faces not interfaced directly with the laser light source), e.g., to cause internal reflections of the inputted light within the wide bandgap photoconductive material of the switch 112. The photoconductive switch package 200 includes the profiled resistive material structure 114 over the wide bandgap photoconductive material of the switch 112, e.g., to allow electric field stress concentration relief in applications of the switch 112 to electrically conduct the electrical signal across the electrodes 111A and 111B, e.g., including high voltage and/or high current signals. As shown in FIG. 2, the switch 112 includes a diffusive structure 212 on one side of the switch body to diffuse the received light from the single laser light source within the wide bandgap photoconductive material of the switch body. In some implementations, for example, the switch 112 as shown in FIG. 2 can exhibit optical illuminations presented underneath the electrode-switch interface 215 (e.g., shown in blue circle) that conducts current in the wide bandgap photoconductive material of the switch body.

In other embodiments of the switch 112, for example, the switch 112 can be configured with a circular switch interface 215. In this example, the diffusive structure 212 is included in one region of the switch body to optically couple the switch interface 215 to the laser light source. For example, the diffusive structures 212 are configured to receive and direct light to the HR coatings 214 on the surface of multi-sided optical-waveguide transverse-feed structures 114 to the switch interface 215. In some embodiments of the switch 112, for example, the switch 112 can be optically coupled to a multi-sided optical waveguide transverse feed structure to which diffusive structures 212 are configured to receive light into the switch 112. In some embodiments of the switch 112, for example, the switch active material interface 215 can be in a hole in a larger piece of a non-photoconductive material (e.g., $SiO_2$) to provide an optical coupling with the laser light source. For example, as shown in FIG. 2, the structure 114 (e.g., illustrated in the diagram as a square block of material) is composed of a clear non-photoconductive material (e.g., $SiO_2$) and having a round hole cut in the middle of it. The switch interface 215 (e.g., illustrated in the diagram as a blue circle, the photoconductive material) is inserted into this hole in the structure 114.

Figure 3:
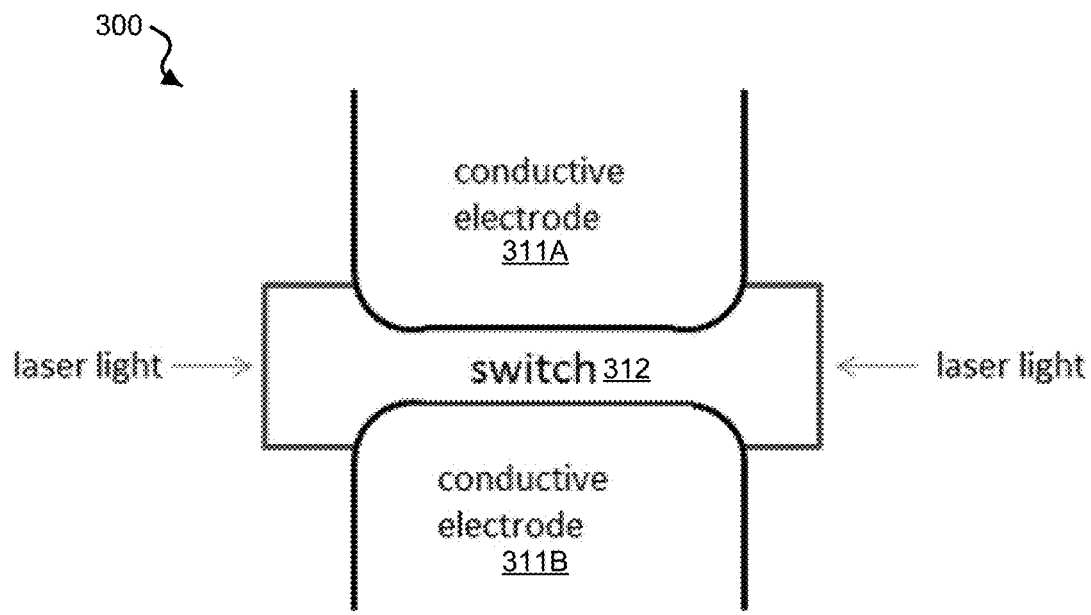
FIG. 3 shows a diagram of an exemplary photoconductive switch package of the disclosed technology including an embedded electrode configuration with the photoconductive switch.

FIG. 3 shows a diagram of an exemplary photoconductive switch package 300 of the disclosed technology including an embedded electrode configuration with the photoconductive switch. The photoconductive switch package 300 is structured to include a photoconductive switch 312 including a wide bandgap photoconductive material, and two 'profiled' conductive electrodes 311A and 311B embedded in and interfaced at opposite ends of the wide bandgap photoconductive material of the switch 312. By embedding the electrodes into the surface of the switch-material (as shown in FIG. 3), for example, the triple point (e.g., metal/air/switch-material intersection point) is moved farther away from the centerline of the electrodes. The electric field stress in this region is lower, thus reducing the potential for breakdown or allowing for higher operating voltages. It is noted, for example, that "air" could be replaced by the exemplary epoxy encapsulant described previously, or the material of the structure 114, in FIG. 1A. For example, the wide bandgap photoconductive material of the switch 312 can include GaN, ZnO, diamond, AlN, SiC, or BN. The switch body can be structured to include opposing concave regions to receive a convex terminal of each of the two electrodes 311A and 311B electrically connected to the switch 312. For example, the electrodes 311A and 311B can be configured to have a contoured profile such as a Rogowski, Bruce, Chang, Harrison, and Ernst profiles. Some examples of the electrodes 311A and 311B are disclosed in U.S. Pat. No. 8,258,632 to Lawrence Livermore National Security, LLC, entitled "OPTICALLY-INITIATED SILICON CARBIDE HIGH VOLTAGE SWITCH WITH CONTOURED-PROFILE ELECTRODE INTERFACES", which is incorporated by reference in its entirety as part of the disclosure of this patent document. The switch 312 is optically coupled to one or more light sources of energetic photons, e.g., such as laser light sources, as shown in FIG. 3. In some implementations, for example, four light sources can be optically interfaced at the four faces of the switch 312. When the laser emits photons into the switch 312, the wide bandgap photoconductive material of the switch 312 conducts an electrical signal between the embedded electrodes 311A and 311B.

Embodiments of a photoconductive switch packaging device including the exemplary photoconductive switch package 300 as shown in FIG. 3 can include one or more of the following exemplary features. For example, the exemplary photoconductive switch packaging device can be configured to have a square photoconductive switch. For example, the exemplary photoconductive switch packaging device can be configured to have an M plane cut. For example, the square photoconductive switch can be configured to have a size of 20 mm×20 mm, with a 3 mm thickness, where the electrodes 311A and 311B are embedded into the switch body at various depths. In some implementations, for example, the electrodes can be embedded until the electric field at the triple point (e.g., metal/air/switch-material) intersection point is reduced to avoid electrical breakdown at the operating voltage. For example, the photoconductive switch can be configured to have an antireflective (AR) coating. For example, an exemplary epoxy encapsulation structure can be configured to have a size of 10 mm×14 mm to surround the exemplary square photoconductive switch. For example, the exemplary photoconductive switch packaging device can be configured to receive the laser light via a fiber feed, e.g., in which the light is transversely fed (e.g., edge fed) by the laser. For example, the laser can be a 532 nm laser. For example, in some implementations, the photoconductive switch packaging device can be configured to have a single module feed into a coax-to-waveguide adapter.

Figure 4:
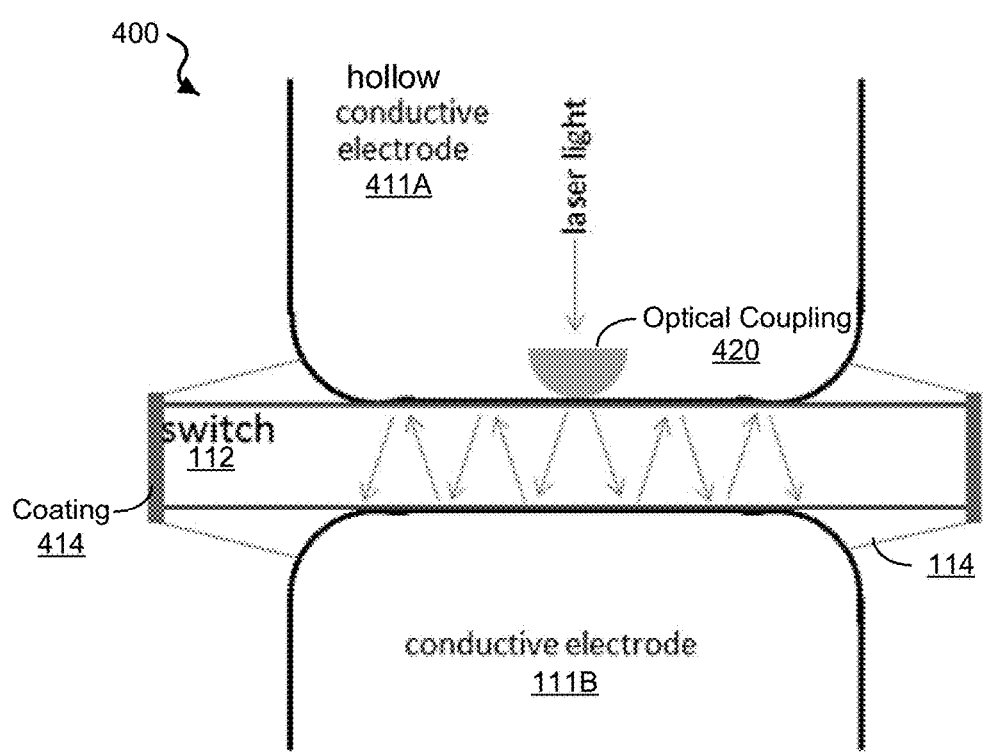
FIG. 4 shows a diagram of an exemplary photoconductive switch package of the disclosed technology including an axial optical feed configuration with the photoconductive switch.

FIG. 4 shows a diagram of an exemplary photoconductive switch package 400 of the disclosed technology including an axial optical feed configuration with the photoconductive switch. The photoconductive switch package 400 includes the photoconductive switch 112 and the profiled resistive structure 114 interfaced between two conductive electrodes 411A and 111B. The electrode 411A is structured to include a hollow cavity, through which light can be carried and transmitted from the source of energetic photons (e.g., laser) into the switch 112 via an optical coupling component 420, e.g., such as a lens. For example, the optical coupling component 420 can include an optically transmissive structure, e.g., including a non-photoconductive switch material, such as SiO$_2$. In some implementations, for example, the optical coupling component 420 is embedded into a hole cut in the wide bandgap photoconductive switch 112 at the interface with the hollow conductive electrode 411A. The example photoconductive switch package 400 can be configured to allow axial-fed light to enter the switch 112 by, e.g., a diffusive structure (e.g., such as the diffusive structure 212), the optical coupling component 420, a transparent conductor in which light enters through the transparent conductor which covers the hole in the end of the hollow conductive electrode, or a grid over the transparent conductor (e.g., such as for high currents). In some embodiments, for example, the photoconductive switch package 400 may include an HR coating 414 for implementations when a laser does not interface with the face or faces of the switch 112.

Embodiments of a photoconductive switch packaging device including the exemplary photoconductive switch package 400 as shown in FIG. 4 can include one or more of the following exemplary features. For example, the exemplary photoconductive switch packaging device can be configured to have an M plane cut. For example, the exemplary photoconductive switch packaging device can be configured to have a rounded photoconductive switch. For example, the rounded (e.g., circular disk) photoconductive switch can be configured to have a diameter of 10 mm, with a 1 mm thickness. For example, the profiled resistive material coating can be configured as a thin film tapered resistive surface treatment, or have constant conductivity with tapered geometric profile resistive material. For example, the photoconductive switch can be configured to have an antireflective (AR) coating and/or a highly reflective (HR) coating, where the AR coating is applied to face(s) of the photoconductive switch that optically interfaces with the light source (e.g., laser) and the HR coating is applied to face(s) where the light source is not interfaced. For example, an HR coating can be configured on the circular edges of the axially fed photoconductive switch. It should b noted that the outer perimeter of the switch may be rounded, square, or other shapes. For example, an exemplary epoxy encapsulation structure can be configured to have a size of 10 mm×14 mm to surround the exemplary rounded photoconductive switch. For example, the exemplary photoconductive switch packaging device can be configured to receive the laser light via a fiber feed, e.g., in which the light is axially fed by the laser through the hollow electrode 411A to the optical coupling structure 420 on an axial surface of the switch. For example, the laser can be a 532 nm laser. For example, the photoconductive switch packaging device can be configured to have a single module feed into a coax-to-waveguide adapter.

Figure 5:
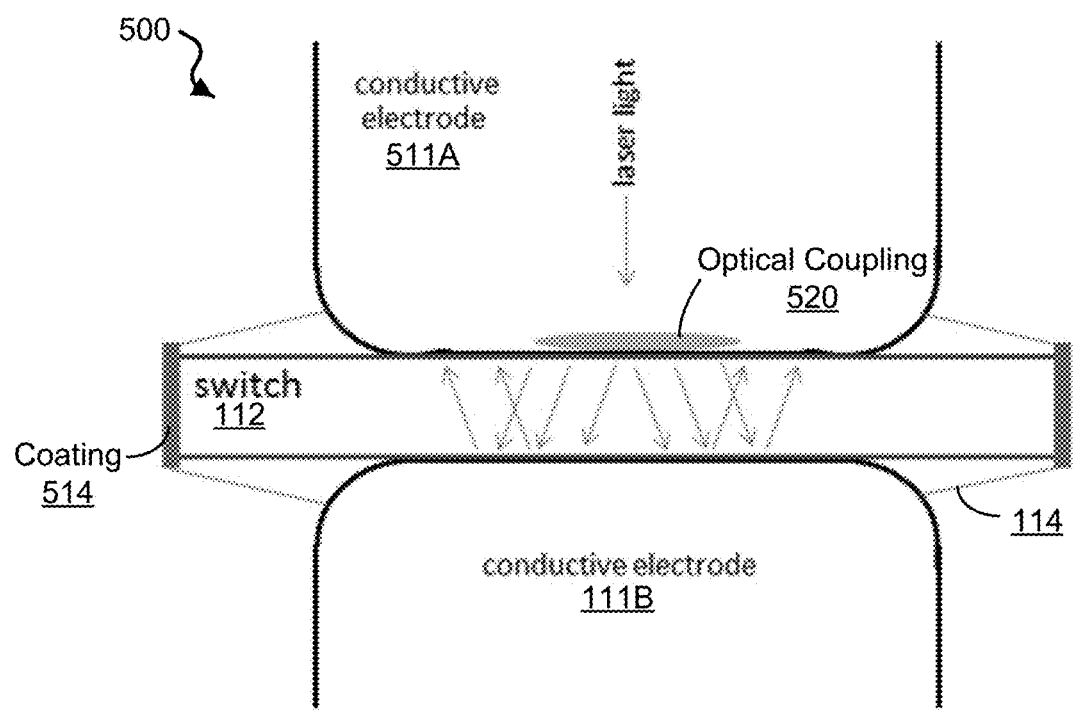
FIG. 5 shows a diagram of an exemplary photoconductive switch package of the disclosed technology including an axial optical feed configuration and diffractive element with the photoconductive switch.

FIG. 5 shows a diagram of an exemplary photoconductive switch package 500 of the disclosed technology including an axial optical feed configuration and diffractive element with the photoconductive switch. The photoconductive switch package 500 includes the photoconductive switch 112 and the profiled resistive structure 114 interfaced between two conductive electrodes 511A and 111B. The electrode 511A is structured to include a hollow cavity, through which light can be carried and transmitted from the source of energetic photons (e.g., laser) into the switch 112 via an optical coupling component 520. For example, the optical coupling component 520 can include an optically transmissive structure, e.g., including a non-photoconductive switch material, such as SiO$_2$. For example, the optical coupling component 520 can include a diffractive optical element (DOE) to direct the light propagation within the circular switch. In some implementations, for example, the optical coupling component 520 is embedded into a hole cut in the wide bandgap photoconductive switch 112 at the interface with the hollow conductive electrode 511A. In some embodiments, for example, the photoconductive switch package 500 may include an HR coating 514 for implementations when a laser does not interface with the face or faces of the switch 112.

Embodiments of a photoconductive switch packaging device including the exemplary photoconductive switch package 500 as shown in FIG. 5 can include one or more of the following exemplary features. For example, the exemplary photoconductive switch packaging device can be configured to have an M plane cut. For example, the exemplary photoconductive switch packaging device can be configured to have a rounded photoconductive switch. For example, the rounded (e.g., circular disk) photoconductive switch can be configured to have a diameter of 10 mm, with a 1 mm thickness. For example, the profiled resistive material coating can be configured as a thin film tapered resistive surface treatment, or have constant conductivity with tapered geometric profile resistive material. For example, the photoconductive switch can be configured to have an antireflective (AR) coating and/or a highly reflective (HR) coating, where the AR coating is applied to face(s) of the photoconductive switch that optically interfaces with the light source (e.g., laser) and the HR coating is applied to face(s) where the light source is not interfaced. For example, the photoconductive switch can be configured to have a diffractive element to direct the light propagation within the exemplary circular switch. For example, an HR coating can be configured on the circular edges of the axially fed photoconductive switch. For example, an exemplary epoxy encapsulation structure can be configured to have a size of 10 mm×14 mm to surround the exemplary rounded photoconductive switch. For example, the exemplary photoconductive switch packaging device can be configured to receive the laser light via a fiber feed, e.g., in which the light is axially fed by the laser through the hollow electrode 511A to the optical coupling structure 520 on an axial surface of the switch. For example, the laser can be a 532 nm laser. For example, the photoconductive switch packaging device can be configured to have a single module feed into a coax-to-waveguide adapter.

In some implementations, for example, the diffractive optical element (DOE) can create patterns from coherent laser beam through a diffraction process (e.g., geometric structures carved into the surface of a flat glass or plastic diffractive element that can act as a lens and create custom output beam patterns). Many shapes and patterns of the DOE are possible. In some embodiments, for example, a flat diffractive element can be used in the photoconductive switch package 500 to act as a lens to spread out the light into a wide-angle space filling pattern in the axial-fed system.

Figure 6:
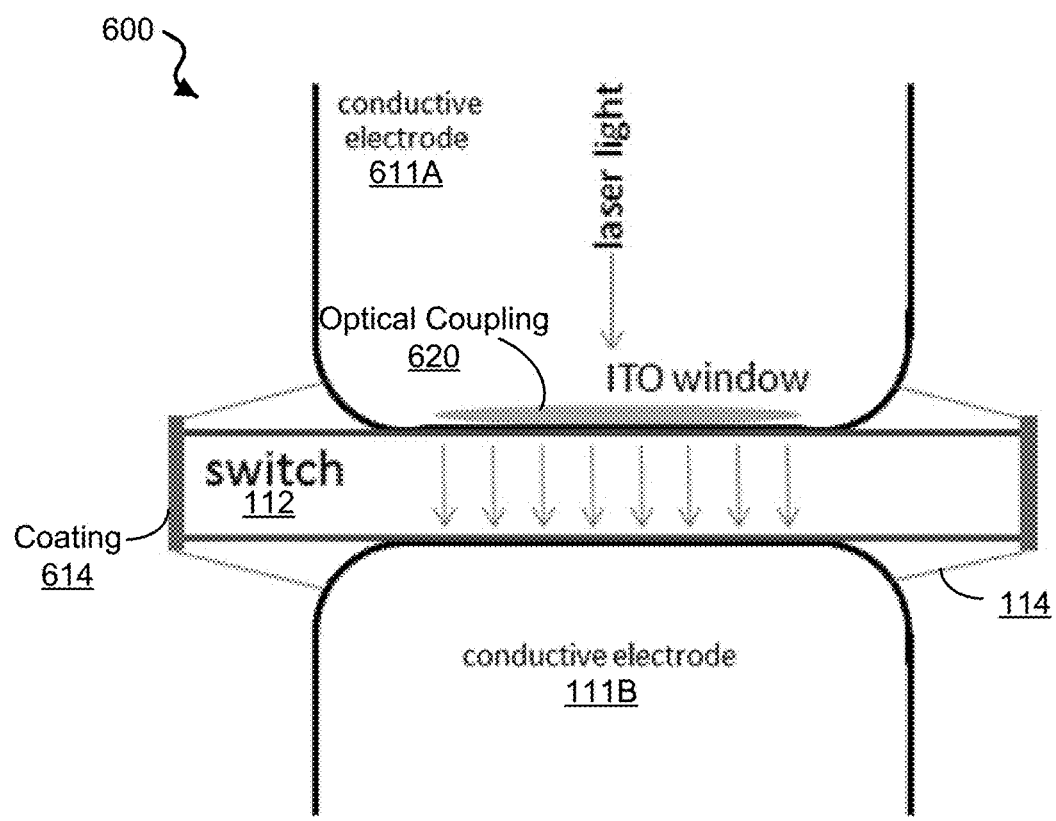
FIG. 6 shows a diagram of an exemplary photoconductive switch package of the disclosed technology including an axial optical feed configuration with the photoconductive switch.

FIG. 6 shows a diagram of an exemplary photoconductive switch package 600 of the disclosed technology including an axial optical feed configuration with the photoconductive switch. The photoconductive switch package 600 includes the photoconductive switch 112 and the profiled resistive structure 114 interfaced between two conductive electrodes 611A and 111B. The electrode 611A is structured to include a hollow cavity, through which light can be carried and transmitted from the source of energetic photons (e.g., laser) into the switch 112 via an ITO-coated optical coupling component 620. For example, the ITO-coated optical coupling component 620 can include a transparent optical structure (e.g., including a non-photoconductive switch material, such as SiO$_2$) that includes an indium tin oxide (ITO) coating on at least one side of the optical structure. In some implementations, for example, the optical coupling component 620 is embedded into a hole cut in the wide bandgap photoconductive switch 112 at the interface with the hollow conductive electrode 611A. In some implementations, for example, the ITO-coated optical coupling component 620 can include a large optical ITO window (or similar conductive, optically transmissive window) with current mesh grid. The example photoconductive switch package 600 can be configured to allow axial-fed light to enter the switch 112 by, e.g., a diffusive structure (e.g., such as the diffusive structure 212), the optical coupling component 420, a transparent conductor in which light enters through the transparent conductor which covers the hole in the end of the hollow conductive electrode, or a grid over the transparent conductor (e.g., such as for high currents). In some embodiments, for example, the photoconductive switch package 600 may include an HR coating 614 for implementations when a laser does not interface with the face or faces of the switch 112

Embodiments of a photoconductive switch packaging device including the exemplary photoconductive switch package 600 as shown in FIG. 6 can include one or more of the following exemplary features. For example, the exemplary photoconductive switch packaging device can be configured to have an M plane cut. For example, the exemplary photoconductive switch packaging device can be configured to have a rounded photoconductive switch. For example, the rounded (e.g., circular disk) photoconductive switch can be configured to have a diameter of 10 mm, with a 1 mm thickness. For example, the profiled resistive material coating can be configured as a thin film tapered resistive surface treatment, or have constant conductivity with tapered geometric profile resistive material. For example, the photoconductive switch can be configured to have an antireflective (AR) coating and/or a highly reflective (HR) coating, where the AR coating is applied to face(s) of the photoconductive switch that optically interfaces with the light source (e.g., laser) and the HR coating is applied to face(s) where the light source is not interfaced. For example, an HR coating can be configured on the circular edges of the axially fed photoconductive switch. For example, an exemplary epoxy encapsulation structure can be configured to have a size of 10 mm×14 mm to surround the exemplary rounded photoconductive switch. For example, the exemplary photoconductive switch packaging device can be configured to receive the laser light via a fiber feed, e.g., in which the light is axially fed by the laser through the hollow electrode 611A to the optical coupling structure 620 on an axial surface of the switch. For example, the laser can be a 532 nm laser. For example, the photoconductive switch packaging device can be configured to have a single module feed into a coax-to-waveguide adapter.

Figure 7:
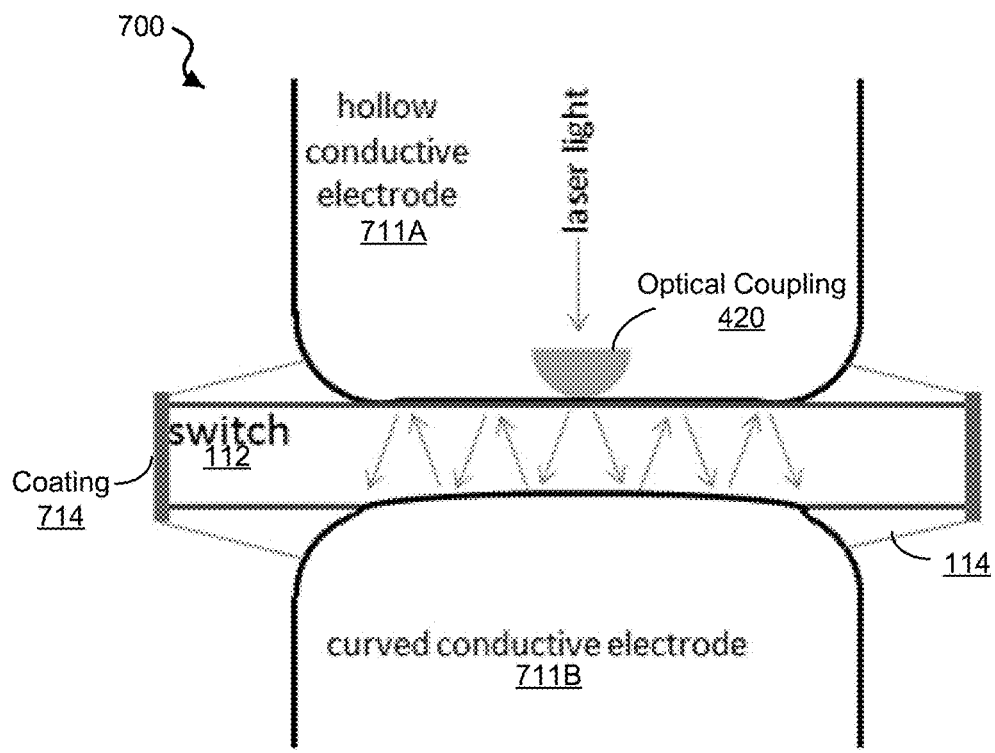
FIG. 7 shows a diagram of an exemplary photoconductive switch package of the disclosed technology including an axial optical feed configuration with the photoconductive switch and a profiled conductive electrode.

FIG. 7 shows a diagram of an exemplary photoconductive switch package 700 of the disclosed technology including an axial optical feed configuration with the photoconductive switch and a profiled conductive electrode. The photoconductive switch package 700 includes the photoconductive switch 112 and the profiled resistive structure 114 interfaced between two conductive electrodes 711A and 711B. The electrode 711A is structured to include a hollow cavity, through which light can be carried and transmitted from the source of energetic photons (e.g., laser) into the switch 112 via an the optical coupling component 420. For example, the optical coupling component 420 can be embedded into a hole cut in the wide bandgap photoconductive switch 112 at the interface with the hollow conductive electrode 711A. The electrode 711B is structured to include a profiled terminal surface that is embedded in and interfaced at one end of the photoconductive switch 112 opposite to the hollow electrode 711A. The body of the switch 112 can be structured to a concave region to receive a convex terminal of the electrode 711B. In some implementations, for example, the electrode 711B can be configured to have a contoured profile such as a Rogowski, Bruce, Chang, Harrison, and Ernst profiles. In some embodiments, for example, the photoconductive switch package 700 may include an HR coating 714 for implementations when a laser does not interface with the face or faces of the switch 112.

Embodiments of a photoconductive switch packaging device including the exemplary photoconductive switch package 700 as shown in FIG. 7 can include one or more of the following exemplary features. For example, the exemplary photoconductive switch packaging device can be configured to have an M plane cut. For example, the exemplary photoconductive switch packaging device can be configured to have a rounded photoconductive switch. For example, the rounded (e.g., circular disk) photoconductive switch can be configured to have a diameter of 10 mm, with a 3 mm thickness (e.g., with a 1 mm active thickness). For example, the profiled resistive material coating can be configured as a thin film tapered resistive surface treatment, or have constant conductivity with tapered geometric profile resistive material. For example, the photoconductive switch can be configured to have an antireflective (AR) coating and/or a highly reflective (HR) coating, where the AR coating is applied to face(s) of the photoconductive switch that optically interfaces with the light source (e.g., laser) and the HR coating is applied to face(s) where the light source is not interfaced. For example, an HR coating can be configured on the circular edges of the axially fed photoconductive switch. For example, an exemplary epoxy encapsulation structure can be configured to have a size of 10 mm×14 mm to surround the exemplary rounded photoconductive switch. For example, the exemplary photoconductive switch packaging device can be configured to receive the laser light via a fiber feed, e.g., in which the light is axially fed by the laser through the hollow electrode 611A to the optical coupling structure 620 on an axial surface of the switch. For example, the laser can be a 532 nm laser. For example, the photoconductive switch packaging device can be configured to have a single module feed into a coax-to-waveguide adapter.

Figure 8:
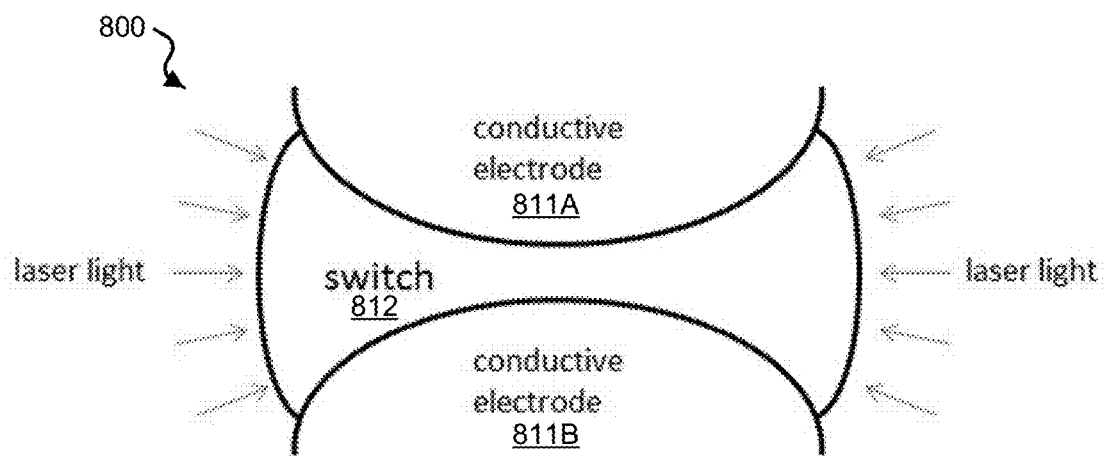
FIG. 8 shows a diagram of an exemplary photoconductive switch package of the disclosed technology including an embedded electrode configuration with a shaped optical entrance of the photoconductive switch where the shaping follows the profile of the electric field lines between the electrodes.

FIG. 8 shows a diagram of an exemplary photoconductive switch package 800 of the disclosed technology including an embedded electrode configuration with a shaped optical entrance of the photoconductive switch. The photoconductive switch package 800 is structured to include a photoconductive switch 812 including a wide bandgap photoconductive material and shaped to include a curved profile to interface with profiled electrodes matched to the shape of the switch 812. The photoconductive switch package 800 includes two profiled conductive electrodes 811A and 811B embedded in and interfaced at opposite ends of the photoconductive switch 812. For example, the wide bandgap photoconductive material of the switch 812 can include GaN, ZnO, diamond, AlN, SiC, or BN. The shaped optical entrance of the body of the switch 812 can be structured to include opposing concave regions to receive a convex terminal of each of the two electrodes 811A and 811B electrically connected to the switch 812. For example, the electrodes 811A and 811B can be configured to have a contoured profile such as a Rogowski, Bruce, Chang, Harrison, and Ernst profiles. The switch 812 is optically coupled to one or more light sources of energetic photons, e.g., such as laser light sources, as shown in FIG. 8. When the laser emits photons into the switch 812, the wide bandgap photoconductive material of the switch 812 conducts an electrical signal between the embedded electrodes 811A and 811B.

Embodiments of a photoconductive switch packaging device including the exemplary photoconductive switch package 800 as shown in FIG. 8 can include one or more of the following exemplary features. For example, the exemplary photoconductive switch packaging device can be configured to have a square photoconductive switch. For example, the exemplary photoconductive switch packaging device can be configured to have an M plane cut. For example, the square photoconductive switch can be configured to have a size of 20 mm×20 mm, with a 3 mm outer thickness and 0.5 mm inner thickness, where the electrodes 811A and 811B are embedded into the switch body at its shaped optical entrance. For example, the photoconductive switch can be configured to have an antireflective (AR) coating. For example, the exemplary photoconductive switch packaging device can be configured to receive the laser light via a fiber, free space, or fiber-lens feed, e.g., in which the light is transversely fed (e.g., edge fed) by the laser. For example, the laser can be a 532 nm laser. For example, in some implementations, the photoconductive switch packaging device can be configured to have a single module feed into a coax-to-waveguide adapter.

Figure 9:
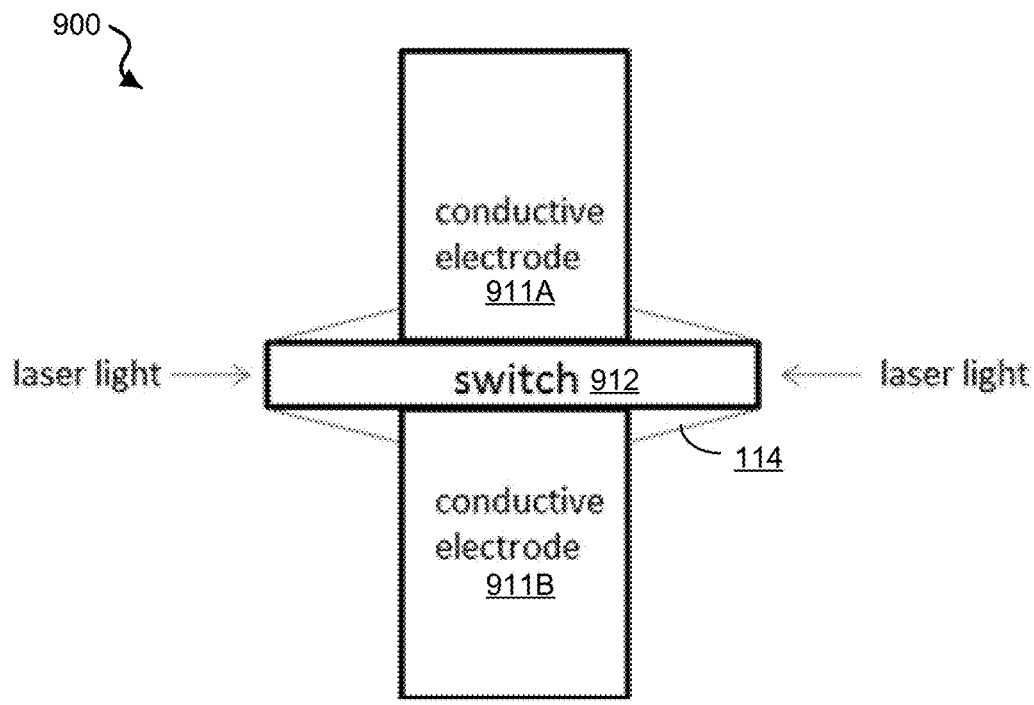
FIG. 9 shows a diagram of an exemplary photoconductive switch package of the disclosed technology including a blunt electrode configuration with a tapered conductive thin film at the interface with the photoconductive switch.

FIG. 9 shows a diagram of an exemplary photoconductive switch package 900 of the disclosed technology including a blunt electrode configuration with a tapered conductive thin film at the interface with the photoconductive switch. The photoconductive switch package 900 includes a photoconductive switch 912 including a wide bandgap photoconductive material and two conductive electrodes 911A and 911B each including a blunt surface that is interfaced at opposite ends of the photoconductive switch 912. For example, the wide bandgap photoconductive material of the switch 912 can include GaN, ZnO, diamond, AlN, SiC, or BN. The photoconductive switch package 912 includes the profiled resistive structure 114 attached to the photoconductive switch to provide relief of electric field stress concentrations to the photoconductive switch 912. In implementations of the photoconductive switch package 900, the photoconductive switch 912 is optically coupled to a source of energetic photons, e.g., such as a laser, and the blunt, conductive electrodes 911A and 911B are electrically connected with a voltage source. When the optical source (e.g., laser) emits photons into the photoconductive switch 112, the wide bandgap photoconductive material of the switch 112 conducts an electrical signal between the electrodes 911A and 911B, e.g., in which the profiled resistive structure 114 can taper the electric field intensity across the profiled material and protect the photoconductive switch package 900.

Embodiments of a photoconductive switch packaging device including the exemplary photoconductive switch package 900 as shown in FIG. 9 can include one or more of the following exemplary features. For example, the exemplary photoconductive switch packaging device can be configured to have a square photoconductive switch. For example, the exemplary photoconductive switch packaging device can be configured to have an M plane cut. For example, the square photoconductive switch can be configured to have a size of 10 mm×10 mm, with a 1 mm thickness. For example, the profiled resistive material coating can be configured as a thin film tapered resistive surface treatment, or have constant conductivity with tapered geometric profile resistive material. For example, the photoconductive switch can be configured to have an antireflective (AR) coating. For example, an exemplary epoxy encapsulation structure can be configured to have a size of 10 mm×14 mm to surround the exemplary square photoconductive switch. For example, the dielectric constant ($\varepsilon_r$) of the profiled resistive material coating can be configured to be 10 times that of the epoxy encapsulation structure. For example, the exemplary photoconductive switch packaging device can be configured to receive the laser light via a fiber feed, e.g., in which the light is transversely fed (e.g., edge fed) by the laser. For example, the laser can be a 532 nm laser. For example, the photoconductive switch packaging device can be configured to have a single module feed into a coax-to-waveguide adapter.

Figure 10:
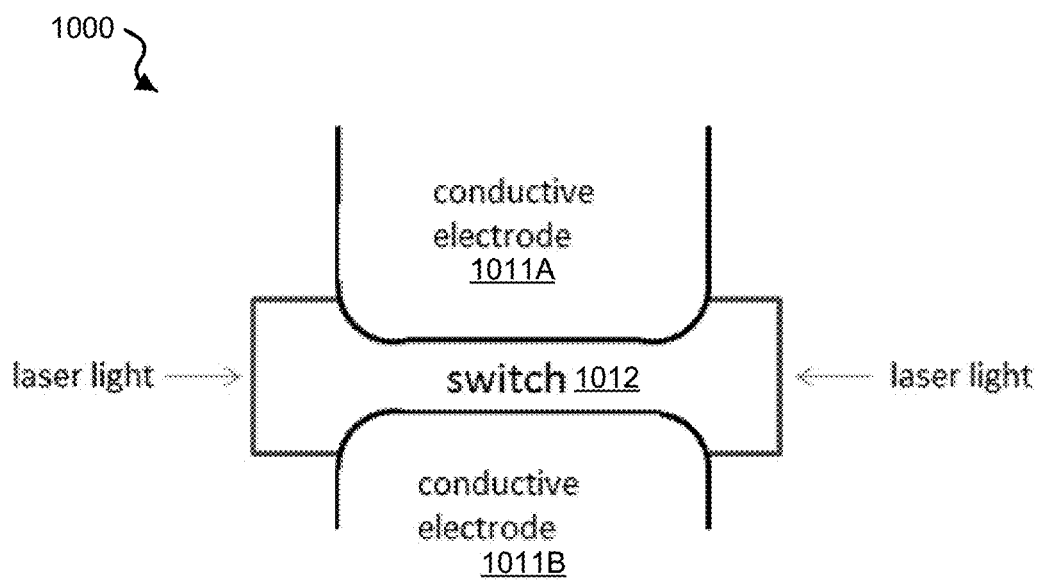
FIG. 10 shows a diagram of an exemplary photoconductive switch package 1000 of the disclosed technology including an embedded electrode configuration with a Rogowski profile of the photoconductive switch.

FIG. 10 shows a diagram of an exemplary photoconductive switch package 1000 of the disclosed technology including an embedded electrode configuration with a Rogowski profile of the photoconductive switch. The photoconductive switch package 1000 is structured to include a photoconductive switch 1012 including a wide bandgap photoconductive material, and two profiled conductive electrodes 1011A and 1011B embedded in and interfaced at opposite ends of the wide bandgap photoconductive material of the switch 1012. For example, the wide bandgap photoconductive material of the switch 1012 can include GaN, ZnO, diamond, AlN, SiC, or BN. For example, the electrodes 1011A and 1011B can be configured to have a contoured profile such as a Rogowski profiles. The switch body can be structured to include opposing concave regions to receive a convex terminal of each of the two electrodes 1011A and 1011B electrically connected to the switch 1012. The switch 1012 is optically coupled to one or more light sources of energetic photons, e.g., such as laser light sources, as shown in FIG. 10. When the laser emits photons into the switch 1012, the wide bandgap photoconductive material of the switch 1012 conducts an electrical signal between the embedded electrodes 1011A and 1011B.

Embodiments of a photoconductive switch packaging device including the exemplary photoconductive switch package 1000 as shown in FIG. 10 can include one or more of the following exemplary features. For example, the exemplary photoconductive switch packaging device can be configured to have a square photoconductive switch. For example, the exemplary photoconductive switch packaging device can be configured to have a 4H material. For example, the square photoconductive switch can be configured to have a size of 10 mm×10 mm, with a 1 mm thickness, where the electrodes 1011A and 1011B are embedded into the switch body at various depths. For example, in some implementations, the photoconductive switch can be configured to have an antireflective (AR) coating. For example, in some implementations, the photoconductive switch package 1000 can include an exemplary epoxy encapsulation structure, which can be configured to have a size of 10 mm×14 mm to surround the exemplary square photoconductive switch. For example, the exemplary photoconductive switch packaging device can be configured to receive the laser light via a free-space feed, e.g., in which the light is transversely fed (e.g., edge fed) by the laser. For example, the laser can be a 532 nm laser (e.g., which can include board based).

Figure 11A:
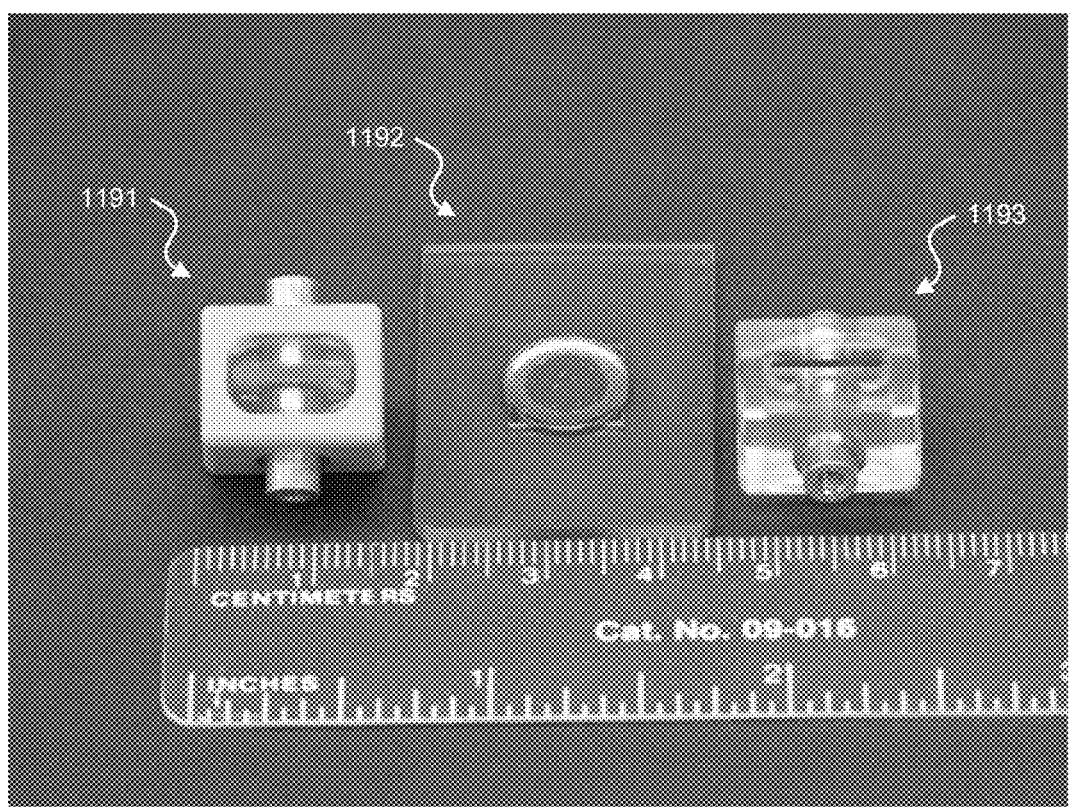
FIG. 11A shows an image of example photoconductive switch packages of the disclosed technology.

FIG. 11A shows an image of example photoconductive switch packages of the disclosed technology. In FIG. 11A, the left-most switch package 1191 in the photo shows a switch between two electrodes in air (e.g., no epoxy encapsulant). The right-most switch package 1193 in the photo shows a switch embedded in epoxy encapsulant. The center switch package 1192 in the photo shows a switch embedded in the epoxy encapsulant with only 1 electrode. It is noted that in the image, for example, the outline of the square switch is barely visible. The feature to note in this photo is the direct contact region of the electrode to the switch (e.g., appearing as the dark circle in the center). This allows another external electrode (not shown) to be applied to the top of the switch as part of implementations.

Figure 11B:
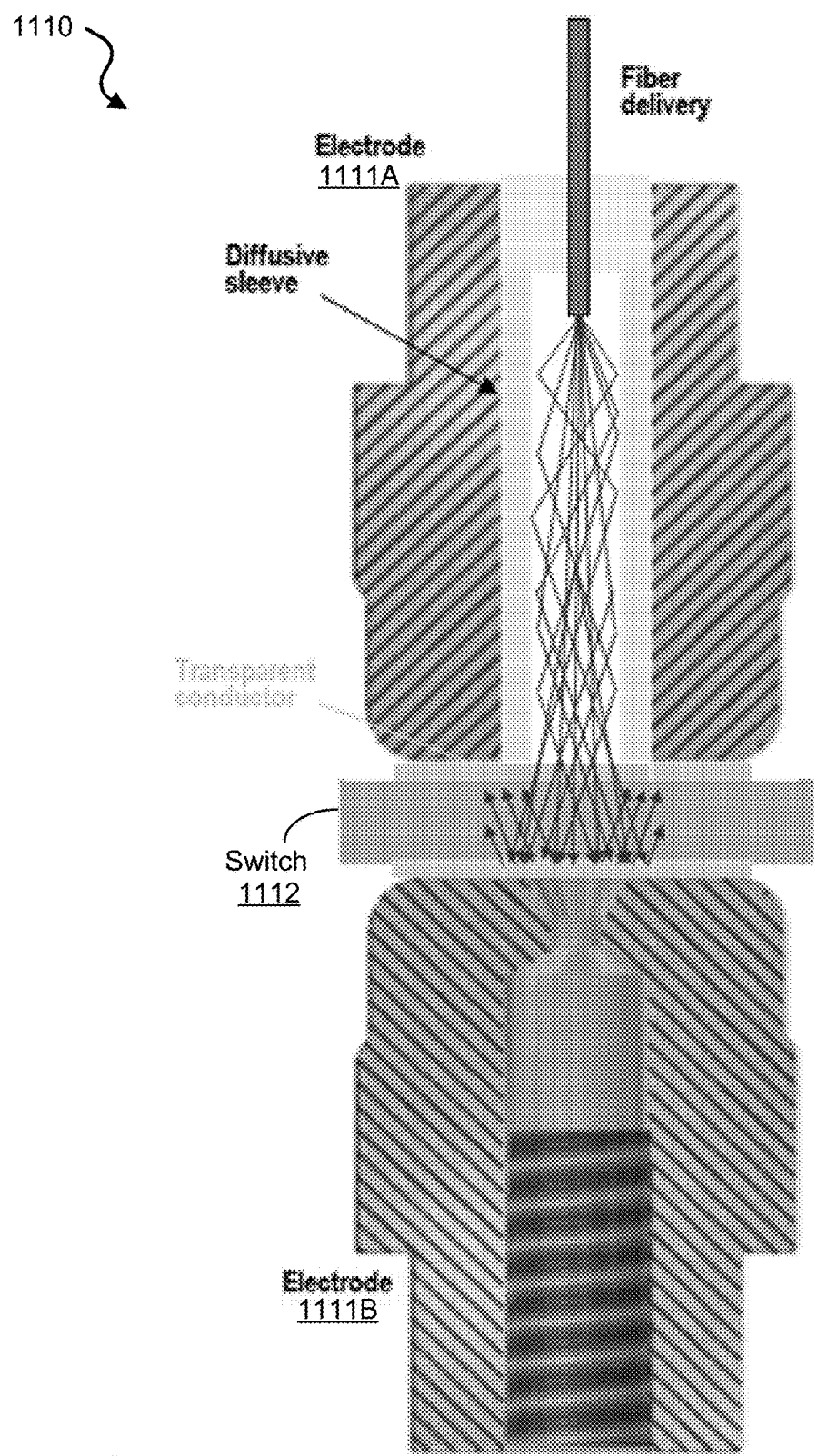
FIG. 11B shows an illustrative diagram of an example of an axially-fed photoconductive switch package of the disclosed technology.

FIG. 11B shows an illustrative diagram of an example of an axially-fed photoconductive switch package 1110 of the disclosed technology. For example, for the axial-fed configurations, such as in FIG. 1H or FIG. 11, the epoxy encapsulant can be configured to couple completely and cover all of the sides of the switch (e.g., switch 112 or switch 1112), e.g., since the light comes into the switch-material axially. Looking closely at FIG. 11, the diagram shows that the edge of the switch material 1112 is exposed (e.g., not covered with epoxy). In some embodiments of the example photoconductive switch package 1110, a 10 mm×10 mm switch 1112 may be used, with a dual-laser feed, and the photoconductive switch package 1110 could have a 10 mm×14 mm encapsulant to cover it, e.g., such as 2 mm of the encapsulant on the two non-exposed sides. In some embodiments of the example photoconductive switch package 1110, a 10 mm×10 mm switch 1112 may be used, with a single-laser feed, and the photoconductive switch package 1110 could have a 12 mm×14 mm encapsulant, e.g., such as 2 mm of encapsulant on the three non-exposed sides. Larger sizes of encapsulation are indeed possible in the edge-fed configurations, e.g., as long as the exposed sides remain exposed. In the axial-fed configuration, for example, the bottom electrode 1111B may either be an electrode (as shown in FIG. 11) or may be a simple flat surface of large extent. Note that in the example shown in FIG. 11, the bottom electrode 1111B may be replaced by a simple large flat metal plate.

Exemplary results of implementations of the disclosed photoconductive switch packaging technology are presented.

Figure 11C:
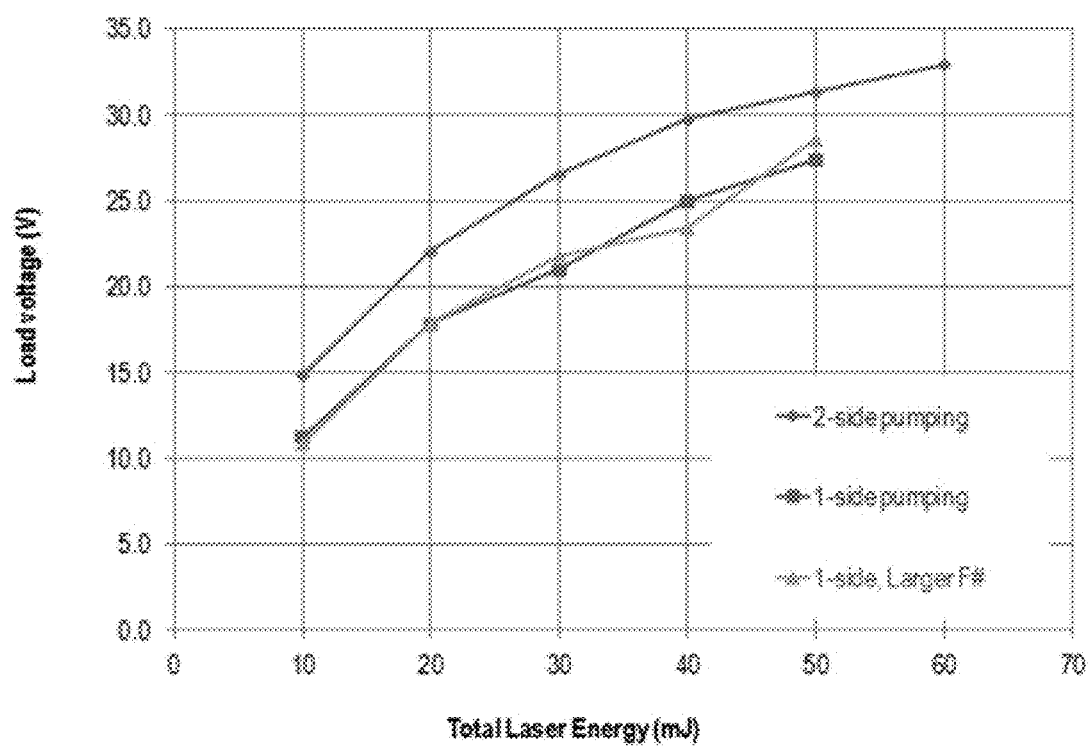
FIG. 11C shows a graph depicting example results of single-sided illumination and the double-sided illuminations.
Figure 11D:
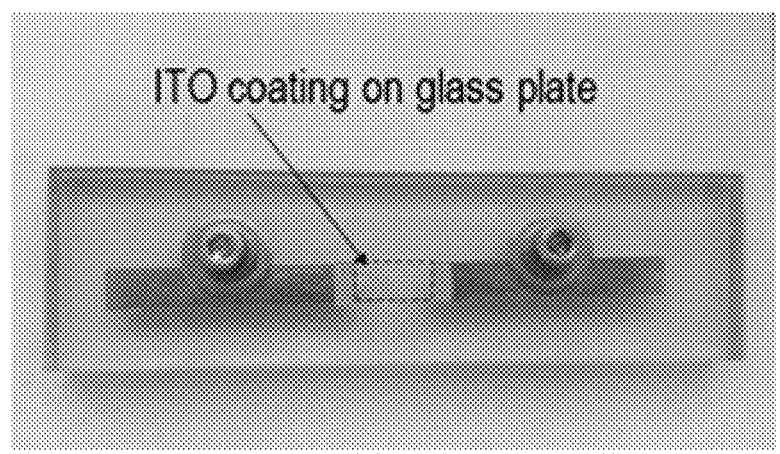
FIG. 11D shows an image of the characterization setup featuring the transparent ITO conductive coating to quantify operational parameters.

In some implementations, for example, an exemplary photoconductive switch package device was operated to achieve 27 kilovolts across 1 mm. FIG. 11C shows a graph depicting example results of such implementations, where there was an approximately 15% difference between the single-sided (e.g., "1-sided pumping") illumination and the double-sided (e.g., "2-sided pumping") illuminations. Notably, the exemplary results indicated that other system components not related to the exemplary photoconductive switch package device were the limiting factor of this voltage (e.g., the 27 kV), thereby suggesting that higher voltages may be operated using the disclosed photoconductive switch packaging technology. FIG. 11D shows an image of the characterization setup featuring the transparent ITO conductive coating, e.g., where 285 nm thick produced 10 ohms per square.

Figure 12:
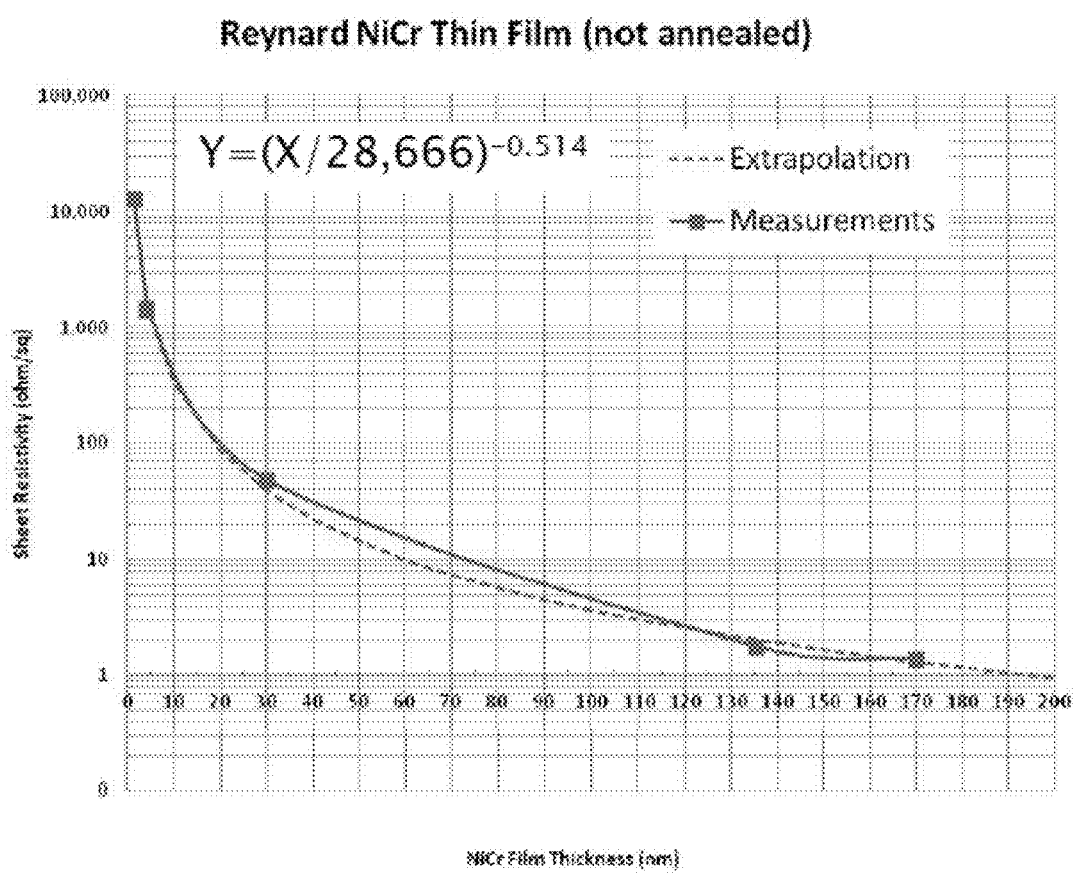
FIG. 12 shows a data plot of the sheet resistivity versus thickness of an example NiCr thin film profiled structure of the present technology.

FIG. 12 shows a data plot of the sheet resistivity versus thickness of an example NiCr thin film profiled structure of the present technology. The data plot includes extrapolated data and measurement data from example implementations testing the NiCr thin film profiled structure.

Figure 13A:
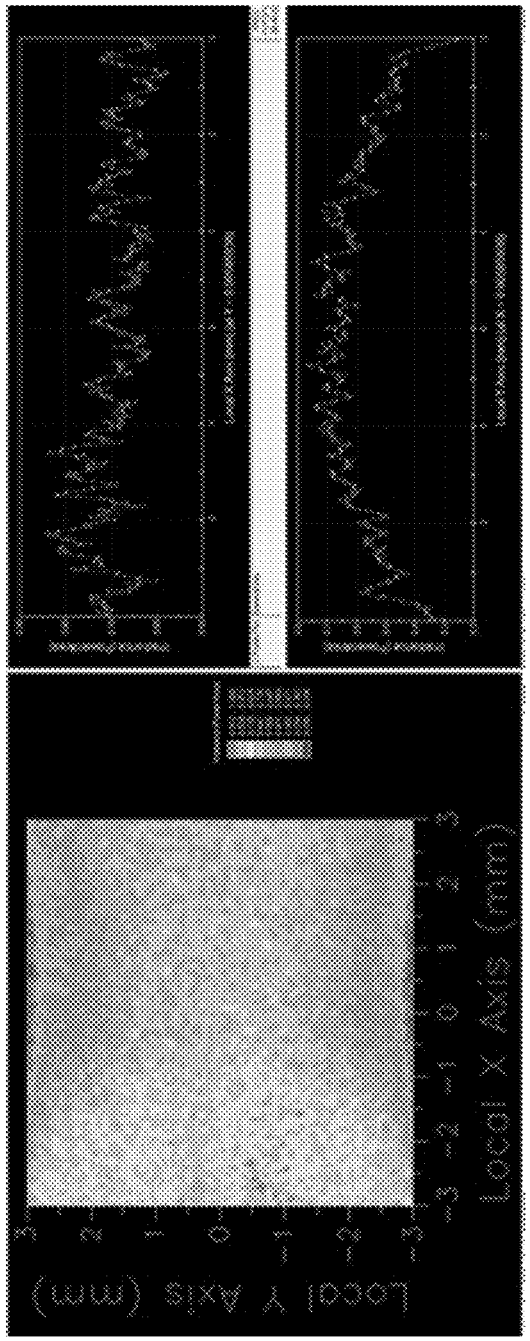
FIGS. 13A and 13B show data plots featuring example results of an optical design simulation of a single-sided illumination and a double-sided illumination, respectively, for a photoconductive switch package of the present technology.
Figure 13B:
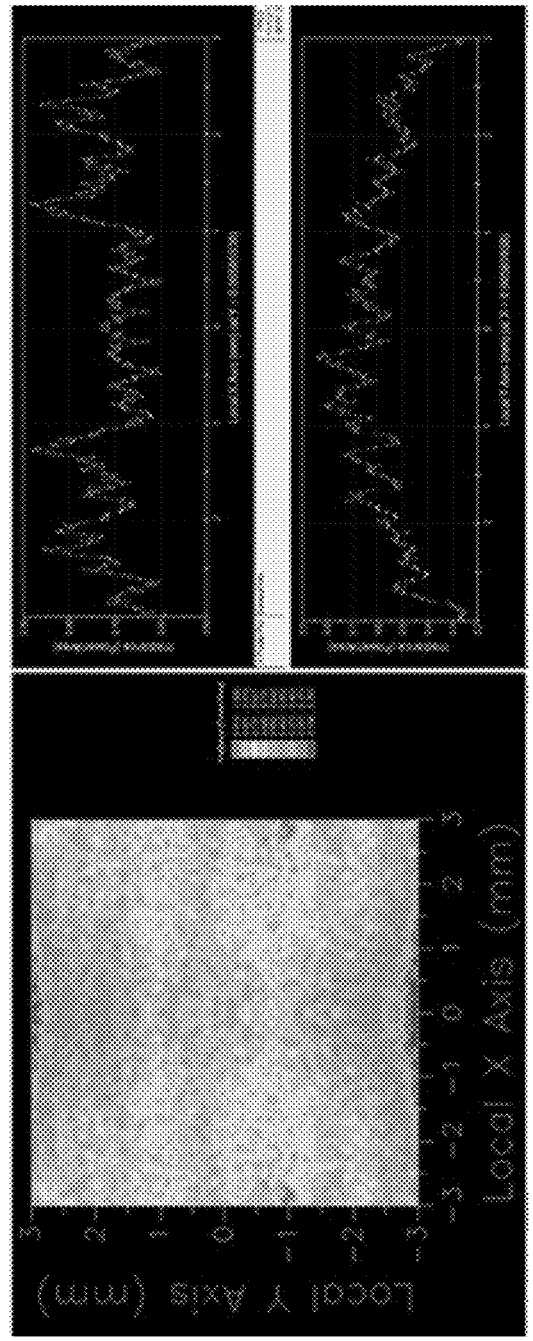

FIGS. 13A and 13B show data plots featuring example results of an optical design simulation of a single-sided illumination (FIG. 13A) and a double-sided illumination (FIG. 13B) for a photoconductive switch package of the present technology. In the exemplary implementations for FIG. 13A, the single-sided optical illumination is on the left edge of an exemplary edge-fed photoconductive switch package (e.g. left edge, in this simulation). In the exemplary implementations for FIG. 13B, the double-sided optical illumination was performed on both the left and the right edges of the exemplary double-edge-fed photoconductive switch package.

Figure 14A:
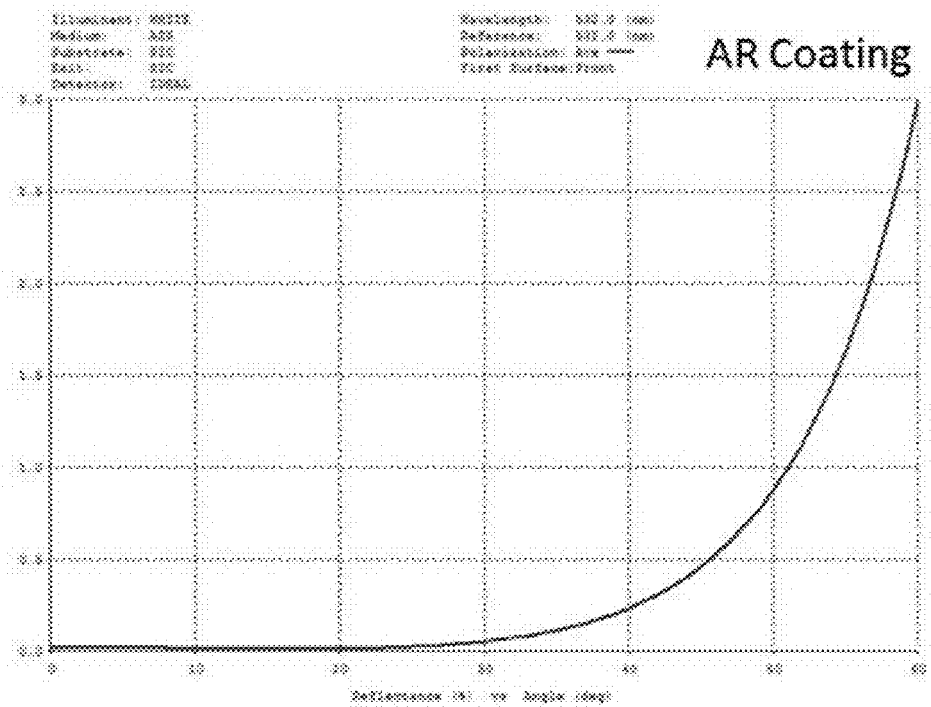
FIGS. 14A and 14B shows data plots of the reflectance (%) versus angle (degrees) of an example AR coating and HR coating, respectively.
Figure 14B:
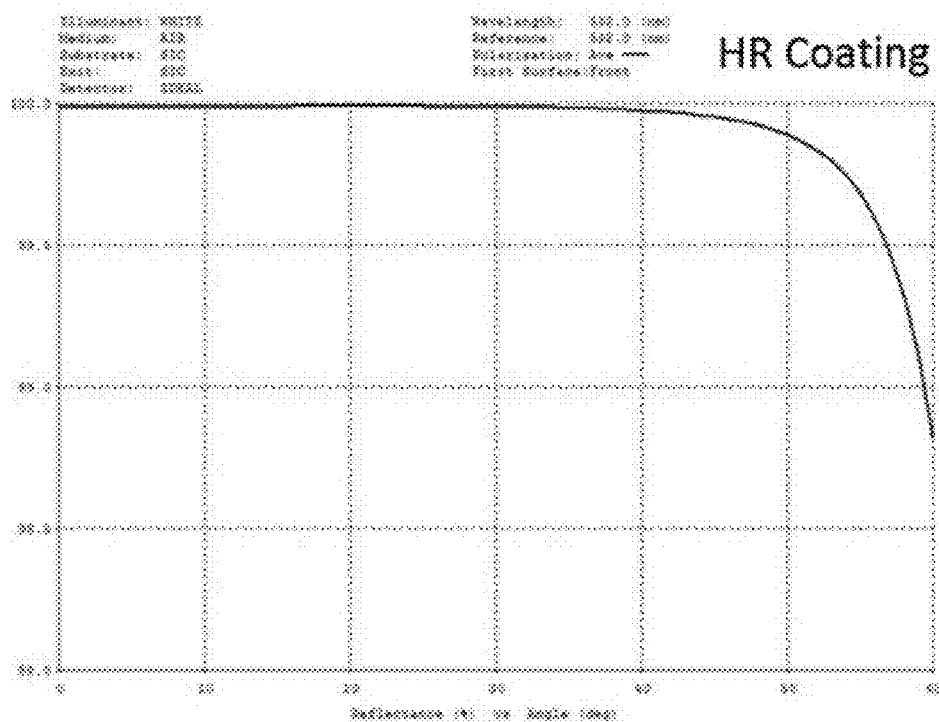

FIGS. 14A and 14B shows data plots of the reflectance (%) versus angle (degrees) of an example AR coating (FIG. 14A) and HR coating (FIG. 14B). In the example implementations for FIG. 14A and FIG. 14B, the illumination was white, the medium was air, the substrate was SiC, the detector was an ideal optical detector, and the laser light beam was at 532 nm.

Figure 15A:
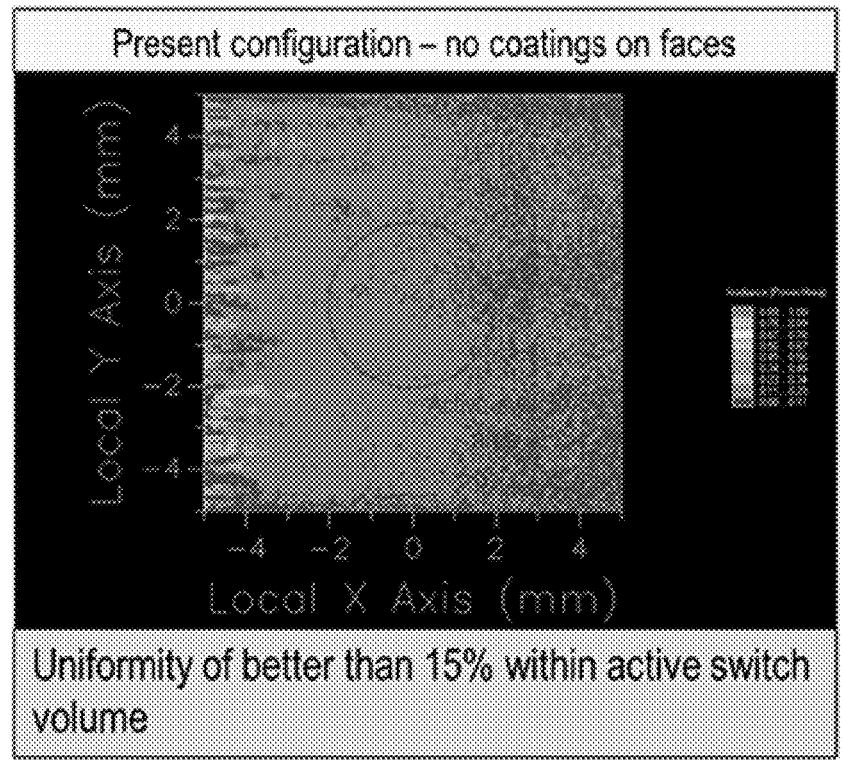
FIGS. 15A and 15B show data plots of simulations using an example photoconductive switch package without and with AR or HR coatings on the faces of the switch, respectively.
Figure 15B:
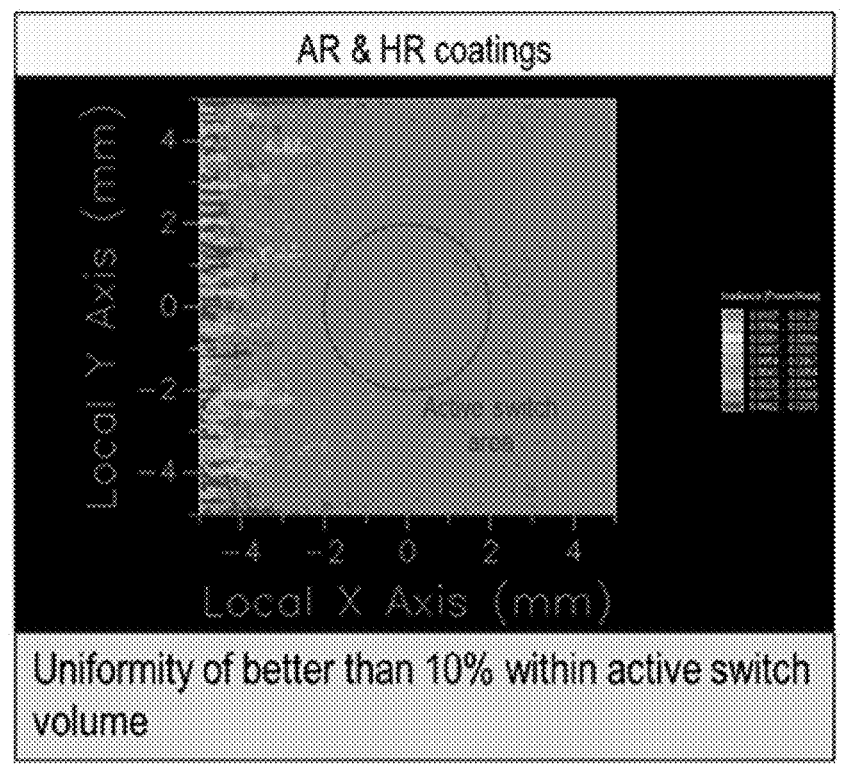

FIGS. 15A and 15B show data plots of an example simulation using an example photoconductive switch package of the present technology without AR or HR coatings on the faces (FIG. 15A) and with AR and HR coatings on the faces (FIG. 15B). In the example implementations for FIG. 15A, the uniformity was shown to be better than 15% within the active switch volume. In the example implementations for FIG. 15B, the uniformity was shown to be better than 10% within the active switch volume.

Figure 16A:
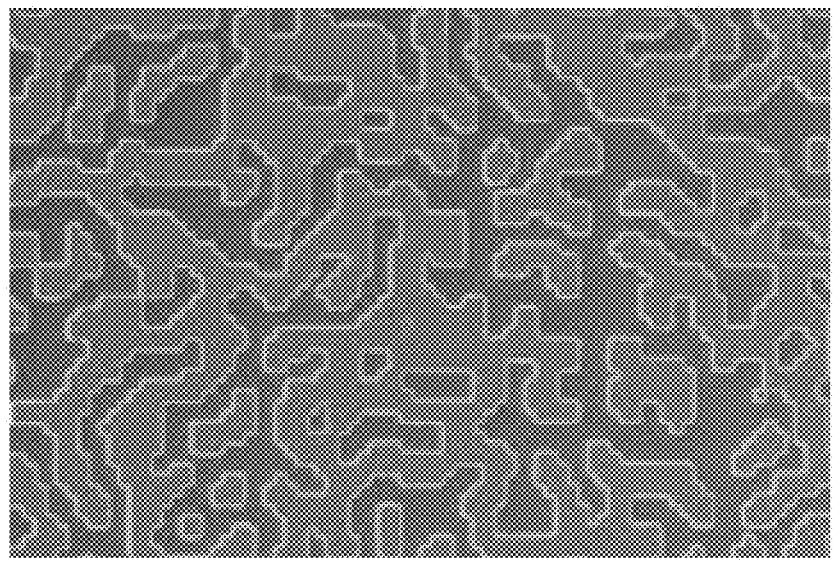
FIGS. 16A and 16B show images of exemplary diffractive optical elements (DOE) that can be employed in the photoconductive switch packages of the disclosed technology.
Figure 16B:
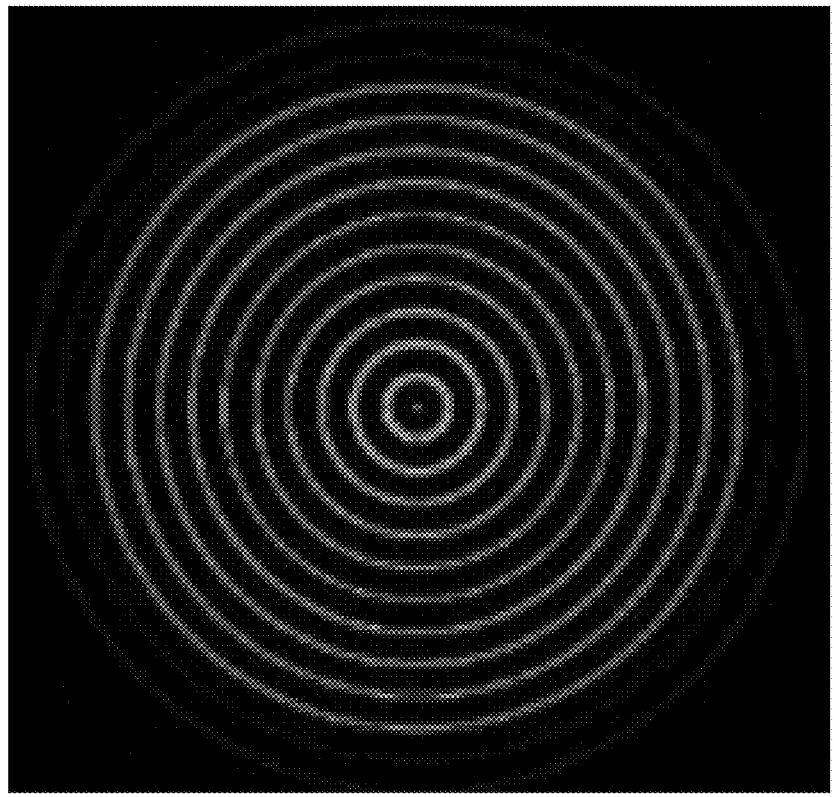

FIGS. 16A and 16B show images of exemplary diffractive optical elements (DOE) that can be employed in the photoconductive switch packages of the disclosed technology. FIG. 16A shows a magnified image of a DOE. FIG. 16B shows an image featuring series of green concentric rings produced by a green laser through a DOE. More arbitrary patterns are also possible (e.g., squares, dot patterns, etc.).

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described and other implementations, enhancements and variations can be made based on what is described and illustrated in this patent document.

What is claimed is:

1. A photoconductive switch package, comprising:
a photoconductive switch including a wide bandgap photoconductive material;
a first electrode and a second electrode interfaced at a first surface and a second surface, respectively, of the photoconductive switch, wherein the first and second electrodes are electrically coupled with a voltage source; and
a profiled resistive element attached to the first and second electrodes and to the photoconductive switch at the opposing first and second surfaces, wherein the profiled resistive element is structured to include a lossy dielectric or resistive material having a tapered profile where a cross section spatially reduces in size along a vertical direction with respect to a horizontal direction,
wherein the photoconductive switch is optically coupled to a light source operable to emit energetic photons to the wide bandgap photoconductive material to cause an electrical signal to conduct between the first and second electrodes via the wide bandgap photoconductive material, and
wherein the electrical signal includes a high voltage at least 5 kV, and wherein the profiled resistive element is structured to provide a defined resistivity curve to allow for reduction of electric field stress concentrations on the photoconductive switch.

2. The photoconductive switch package of claim 1, further comprising:
an encapsulation structure that surrounds the photoconductive switch and a portion of the first and second electrodes excluding two openings of the encapsulation structure on opposing sides of the photoconductive switch that at least partially expose the photoconductive switch and allow the light source to emit the light to the photoconductive switch.

3. The photoconductive switch package of claim 2, wherein the encapsulation structure includes a dielectric material.

4. The photoconductive switch package of claim 3, wherein the dielectric material includes epoxy.

5. The photoconductive switch package of claim 1, wherein the high voltage is at least 25 kV.

6. The photoconductive switch package of claim 1, wherein the wide bandgap photoconductive material includes at least one of GaN, ZnO, diamond, AlN, SiC, or BN.

7. The photoconductive switch package of claim 1, wherein the light source includes a laser.

8. The photoconductive switch package of claim 7, wherein photoconductive switch includes an antireflective coating on the surface of the photoconductive switch to which the laser is optically coupled.

9. The photoconductive switch package of claim 7, wherein the photoconductive switch package is configured to receive the emitted light from the laser using an optical fiber feed aligned transversely with the photoconductive switch.

10. The photoconductive switch package of claim 9, wherein the optical fiber feed includes a single module feed into a coax-to-waveguide adapter.

11. The photoconductive switch package of claim 1, further comprising:
a high refection (HR) surface coating on a plurality of surfaces of the photoconductive switch to cause internal reflections of the emitted light within the wide bandgap photoconductive material.

12. The photoconductive switch package of claim 1, wherein the photoconductive switch is structured a concave region on one or both of the first surface and the second surface, and wherein one or both of the first electrode and the second electrode are structured to include a convex terminal to interface with the concave region of the photoconductive switch.

13. The photoconductive switch package of claim 12, wherein the convex terminal includes a contoured profile that conforms to one of a Rogowski, Bruce, Chang, Harrison, or Ernst profile.

14. The photoconductive switch package of claim 1, wherein the first electrode is structured to include a hollow interior at a terminal end of the first electrode that electrically couples to the photoconductive switch, wherein the light source is optically coupled to the photoconductive switch through the hollow interior of the first electrode to axially feed the emitted light to the photoconductive switch.

15. The photoconductive switch package of claim 14, further comprising:
an optical coupling component including an optically transmissive material located at the interface between the first electrode and the photoconductive switch.

16. The photoconductive switch package of claim 15, wherein the optical coupling component includes silicon oxide (SiO2).

17. The photoconductive switch package of claim 15, wherein the optical coupling component includes a diffusive element.

18. The photoconductive switch package of claim 15, wherein the optical coupling component includes ITO coating structured to include a current mesh grid.

19. The photoconductive switch package of claim 1, wherein one or both of the first electrode and the second electrode are structured to include at least one blunt terminal to interface with the photoconductive switch.

20. A photoconductive switch package, comprising:
a photoconductive switch including a wide bandgap photoconductive material;
a first electrode and a second electrode interfaced at a first surface and a second surface, respectively, of the photoconductive switch, wherein the first and second electrodes are electrically coupled with a voltage source;
a profiled resistive element attached to the first and second electrodes and to the photoconductive switch at the opposing first and second surfaces, wherein the profiled resistive element is structured to include a lossy dielectric or resistive material having a tapered profile where a cross section spatially reduces in size along a vertical direction with respect to a horizontal direction; and
a transparent and electrically conductive coating including indium tin oxide (ITO) or zinc oxide (ZnO) between the profiled resistive element and the photoconductive switch,
wherein the photoconductive switch is optically coupled to a light source operable to emit energetic photons to the wide bandgap photoconductive material to cause an electrical signal to conduct between the first and second electrodes via the wide bandgap photoconductive material.

21. The photoconductive switch package of claim 20, wherein the transparent and electrically conductive coating is on external surfaces of the photoconductive switch.

22. A method for photoconductive switching, comprising:
providing a photoconductive switch including a wide bandgap photoconductive material between a first electrode and a second electrode interfaced at a first surface and a second surface, respectively, of the photoconductive switch, and a profiled resistive element attached to the first and second electrodes and to the photoconductive switch at the opposing first and second surfaces, wherein the profiled resistive element includes a lossy dielectric or resistive material having a tapered cross section spatially reducing in size along a vertical direction with respect to a horizontal direction;
applying, from a voltage source, a high voltage of at least 5 kV across the first and second electrodes;
emitting, from a light source, energetic photons to the wide bandgap photoconductive material to cause an electrical current to conduct between the first and second electrodes via the wide bandgap photoconductive material; and
reducing, at the profiled resistive element, electric field stress concentrations on the photoconductive switch.

23. The method of claim 22, wherein the high voltage is at least 25 kV.

24. The method of claim 22, wherein the wide bandgap photoconductive material includes at least one of GaN, ZnO, diamond, AlN, SiC, or BN.

25. The method of claim 22, wherein the light source includes a laser.

26. The method of claim 22, further comprising:
optically confining the energetic photons within the wide bandgap photoconductive material via a high refection (HR) surface coating on a plurality of surfaces of the photoconductive switch to cause internal reflections of the energetic photons within the wide bandgap photoconductive material.

27. The method of claim 22, wherein the emitting includes transversely feeding the emitted energetic photons to the photoconductive switch one side of the photoconductive switch.

28. The method of claim 22, wherein the emitting includes axially feeding the emitted energetic photons to the photoconductive switch via a hollow interior at a terminal end of the first electrode that electrically couples to the photoconductive switch.

29. The method of claim 28, further comprising:
diffusing the axially fed energetic photons into the photoconductive switch.

* * * * *